(12) United States Patent
Takehara et al.

(10) Patent No.: US 10,649,253 B2
(45) Date of Patent: May 12, 2020

(54) DISPLAY PANEL AND MANUFACTURING METHOD OF DISPLAY PANEL

(71) Applicant: Japan Display Inc., Tokyo (JP)

(72) Inventors: Toshifumi Takehara, Tokyo (JP); Shigesumi Araki, Tokyo (JP)

(73) Assignee: Japan Display Inc., Tokyo (JP)

( * ) Notice: Subject to any disclaimer, the term of this patent is extended or adjusted under 35 U.S.C. 154(b) by 25 days.

(21) Appl. No.: 15/978,531

(22) Filed: May 14, 2018

(65) Prior Publication Data

US 2018/0341148 A1 Nov. 29, 2018

(30) Foreign Application Priority Data

May 25, 2017 (JP) .................................. 2017-103974

(51) Int. Cl.
*G02F 1/1333* (2006.01)
*G02F 1/1335* (2006.01)
*G02F 1/1345* (2006.01)
*H01L 27/12* (2006.01)

(52) U.S. Cl.
CPC .... *G02F 1/133305* (2013.01); *G02F 1/13452* (2013.01); *G02F 1/133512* (2013.01); *H01L 27/1214* (2013.01); *G02F 1/13338* (2013.01)

(58) Field of Classification Search
CPC ......... G02F 1/133305; G02F 1/133512; G02F 1/13452; G02F 1/13338; H01L 27/1214
See application file for complete search history.

(56) References Cited

U.S. PATENT DOCUMENTS

2009/0244456 A1 10/2009 Miyazaki et al.
2016/0259210 A1* 9/2016 Kim .................. G02F 1/133617
2017/0269439 A1* 9/2017 Hyodo .................. G02F 1/1368

FOREIGN PATENT DOCUMENTS

| JP | H06-214111 A | 8/1994 |
|----|----|----|
| JP | 2533301 B2 | 9/1996 |
| JP | H09-197391 A | 7/1997 |
| JP | 2009-230072 A | 10/2009 |

\* cited by examiner

*Primary Examiner* — Phu Vu
(74) *Attorney, Agent, or Firm* — Michael Best & Friedrich LLP

(57) ABSTRACT

A display panel including a first substrate including a pixel electrode, a second substrate, a third substrate, a liquid crystal layer between the first substrate and the second substrate, and a color filter. The first substrate is located between the liquid crystal layer and the color filter. The first substrate includes a first resin base, or the second substrate includes a second resin base. A display panel may include a first polarizer plate. The third substrate may be located between the first substrate and the first polarizer plate.

15 Claims, 30 Drawing Sheets

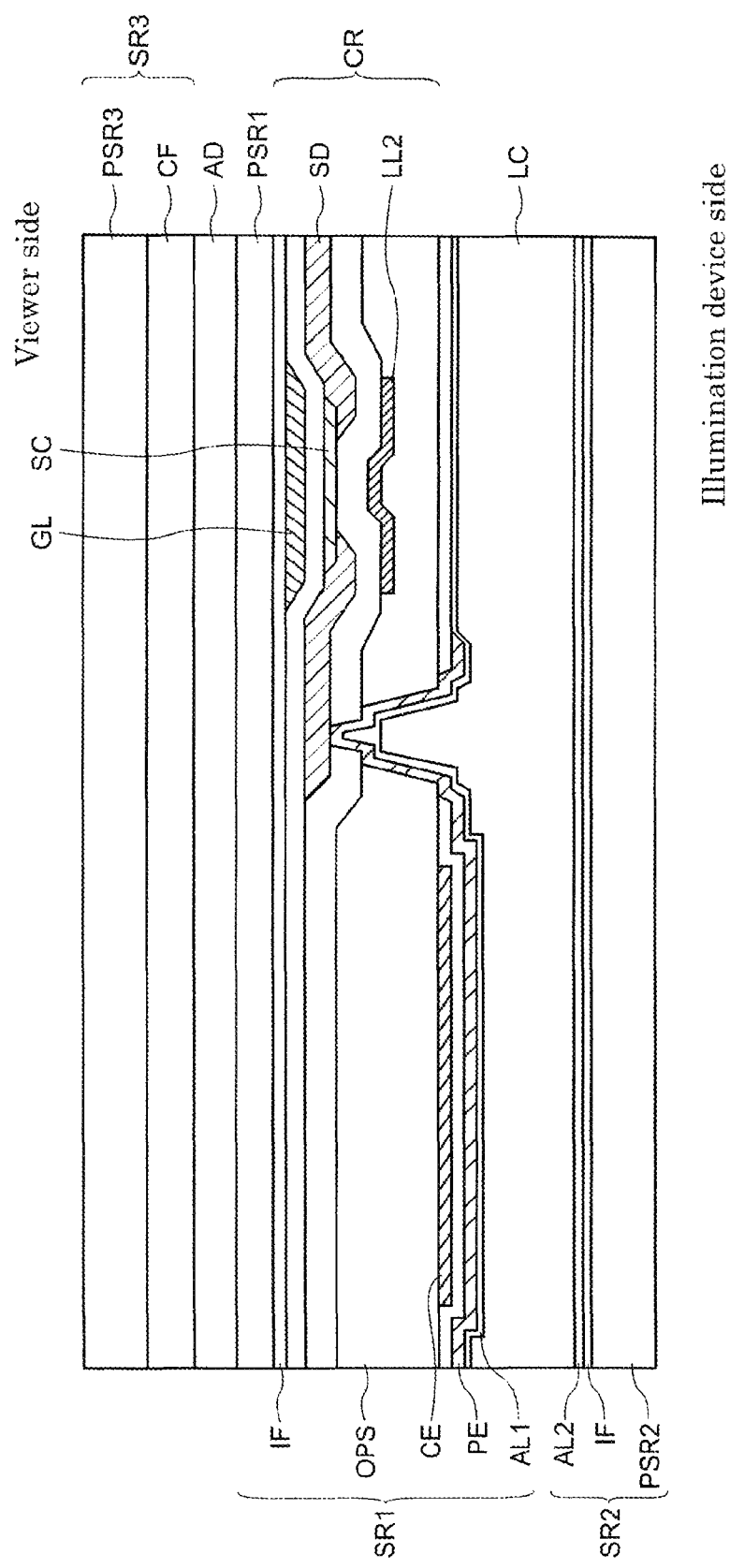

DISPLAY PANEL AND MANUFACTURING METHOD OF DISPLAY PANEL

CROSS REFERENCE TO RELATED APPLICATIONS

This application is based upon and claims the benefit of priority from the prior Japanese Patent Application No. 2017-103974 filed on May 25, 2017, the entire contents of which are incorporated herein by reference.

FIELD

The present invention relates to a display panel including a substrate provided with a color filter in addition to a display cell using a resin base.

BACKGROUND

As a liquid crystal display panel, a display panel using a flexible resin base has been known (see Japanese Patent Application Laid-Open No. 2009-230072). The display panel includes a pair of substrates which are aligned and superimposed. When such a display panel is used, a display device designed to be thinned or curved at its end portion can be implemented. A display panel in which a color filter layer is formed at a position other than a position between the pair of substrates with a liquid crystal layer sandwiched therebetween has been known (Japanese Patent No. 2533301 Specification, Japanese Patent Application Laid-Open No. H06-214111, and Japanese Patent Application Laid-Open No. H09-197391).

However, each of substrates in the liquid crystal display panel is largely in contact with the liquid crystal layer. Therefore, these substrates are bonded to each other with only a sealant having a small width at their periphery region. In addition, the flexible resin base has flexibility and expandability. In processes for manufacturing a liquid crystal display device using such a resin base, a pixel electrode in a sub-pixel region in a transistor substrate and a color filter in a sub-pixel region in an opposite substrate may shift in position from each other (hereinafter referred to as a "shift in position"). For example, processes for manufacturing the display panel include a step of attaching an optical film and a step of separating a protection film from the substrate before attaching the optical film. In this case, either one of a first substrate SR1 and a second substrate SR2 is pulled by an apparatus used in this step, as illustrated in FIG. 24. As a result, one of the substrates may shift in position from the other substrate. The shift in position may occur in an entire display region. The shift in position between substrates may occur in steps such as a step of adsorption to a conveyance medium when the display device is conveyed, a step of separating a glass substrate from a resin base, and a step of heating (autoclaving) for removing bubbles on a polarizer plate. In addition, the flexible resin base bends in a thickness direction of a liquid crystal layer. As a result, a shift in position may occur between the substrates.

If an end side 73a of a flexible display panel is curved, as illustrated in FIG. 25, one of a first substrate SR1 and a second substrate SR2 may shift in position from the other substrate. When the shift in position occurs between the pair of substrates, a light which is inherently transmitted a color filter is not irradiated to the color filter, and an image to be displayed cannot be displayed.

SUMMARY

One embodiment of the present invention is directed to overcoming the above-described problems, and specific means are as follows.

1) A display panel including a first substrate including a pixel electrode, a second substrate, a liquid crystal layer located between the first substrate and the second substrate, and a color filter. The first substrate is located between the liquid crystal layer and the color filter. The first substrate includes a first resin base, or the second substrate includes a second resin base.

2) A manufacturing method of a display panel, including a first forming step including obtaining a first precursor substrate by forming a first resin base on a first rigid substrate and forming a pixel electrode on the first resin base, a second forming step including obtaining a second precursor substrate including a second rigid substrate, a third forming step including obtaining a third precursor substrate by forming a color filter on the third rigid substrate, a first bonding step including bonding the first precursor substrate and the second precursor substrate to each other with a sealant, a first peeling step including obtaining a first substrate including the first resin base and the pixel electrode by peeling the first rigid substrate from the first resin base after the first bonding step, and a second bonding step including bonding the third precursor substrate to a surface of the first resin base after the first peeling step.

BRIEF DESCRIPTION OF DRAWINGS

FIG. 7 is a cross-sectional view along a line I-I' in FIG. 3;

DESCRIPTION OF EMBODIMENTS

Figure 1:
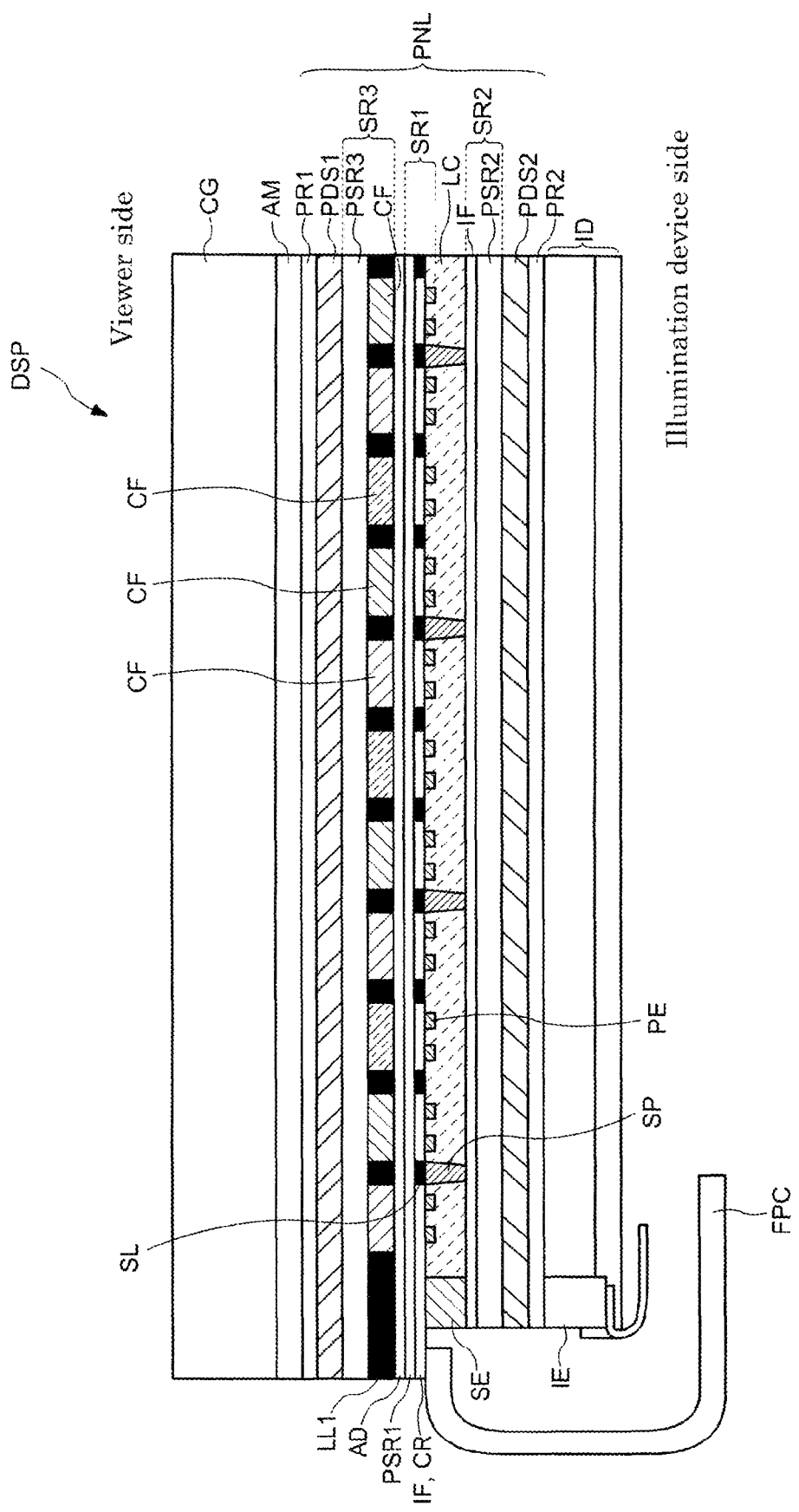
FIG. 1 is a cross-sectional view of a liquid crystal display device according to a first embodiment.

A content of a liquid crystal display panel according to the present invention will be specifically described below with reference to embodiments.

Although some embodiments of the present invention will be described below, these are presented by way of example and are not intended to limit the scope of the invention. These new embodiments can be performed in various other forms, and various omissions, substitutions, and changes can be made without departing from the gist of the invention. A matter which could have been easily conceived by those skilled in the art for appropriate changes without departing from the gist of the invention is duly encompassed in the scope of the invention.

Some embodiments will be described with reference to the drawings. The drawings may be more schematically represented than those in an actual form to make the illustration clearer. However, this is merely an example, and is not intended to limit the interpretation of the present invention. In the respective drawings, symbols may be omitted for identical or similar elements continuously arranged. An adhesive layer for bonding members to each other may be omitted. In the specification and the drawings, components which respectively fulfil identical or similar functions to those already described may be assigned the same reference numerals to omit overlapping detailed descriptions.

In the specification, expressions "α includes A, B, or C", "α includes any one of A, B, and C", and "α includes one selected from a group consisting of A, B, and C" do not exclude a case where α includes a plurality of combinations of A to C, until otherwise indicated. Further, the expressions do not exclude a case where α includes other elements.

In the following description, a display device DSP serving as a liquid crystal display device is disclosed as an example of a display device. The display device DSP can be used for various types of electronic devices such as a smartphone, a tablet terminal, mobile phone terminal, a personal computer, a television receiver, an in-vehicle device, a game device, and a wearable terminal.

(First Embodiment)

FIG. 1 is a cross-sectional view of a liquid crystal display device according to a first embodiment. A display device DSP includes a first substrate SR1 including a pixel electrode PE, a second substrate SR2 facing to the first substrate SR1, a third substrate SR3 including a color filter CF, optical films such as a polarizer plate PR and a phase difference plate PDS, and other members such as a flexible circuit board FPC and a cover member CG. The first substrate SR1 and the third substrate SR3 are arranged on the side closer to a viewer (on the side closer to image display) in the display device DSP than the second substrate SR2.

The first substrate SR1 includes a first resin base PSR1, a circuit layer CR, the pixel electrode PE, and a spacer SP. The spacer SP determines a distance between the first substrate SR1 and the second substrate SR2. In the circuit layer CR, a transistor TR, an insulating film IF, and a video line SL are formed. The second substrate SR2 includes a second resin base PSR2 and an insulating film IF which contacts the second resin base PSR2. The second substrate SR2 is bonded to the first substrate SR1 with a sealant SE interposed therebetween. A liquid crystal layer LC is sealed between the substrates SR1 and SR2 using the sealant SE. The third substrate SR3 includes a third resin base PSR3, the color filter CF, and a first light shielding film LL1. The third substrate SR3 is bonded to the first substrate SR1 with an adhesive layer AD interposed therebetween. The first substrate SR1, the second substrate SR2, and the third substrate SR3 may each include a rigid base such as glass, respectively, instead of resin bases PSR (the first resin base PSR1, the second resin base PSR2, and the third resin base PSR3). This configuration causes the strength of a display panel PNL to be improved.

In the present embodiment, the color filter CF, which has been conventionally formed in the second substrate SR2, is formed in the third resin base PSR3 prepared separately from the second substrate SR2. Since the adhesive layer AD is formed on respective entire surfaces of the first substrate SR1 and the third substrate SR3, the first substrate SR1 and the third substrate SR3 are bonded to each other at a high strength. Accordingly, in processes for manufacturing the display panel PNL and the display device DSP, the pixel electrode PE in a sub-pixel region (defined by the video line SL and a scanning line GL) of the first substrate SR1 and the color filter CF in a sub-pixel region (defined by the first light shielding film LL1) of the third substrate SR3 are prevented from shifting in position. The color filter CF may be directly formed in the first substrate SR1.

The third substrate SR3 includes the first light shielding film LL1. The first light shielding film LL1 is positioned between the cover member CG and wirings (e.g., the video line SL and the scanning line GL). Accordingly, even if external light is reflected by each of the wirings, image visibility does not decrease. The adhesive layer AD may be at a position overlapping a display region DA in the first substrate SR1. More specifically, the adhesive layer AD may be located between the pixel electrode PE and the color filter CF and between the video line SL and the light shielding film LL1.

The first phase difference plate PDS1 and a first polarizer plate PR1 are attached to the third substrate SR3. A second phase difference plate PDS2 and a second polarizer plate PR2 are attached to the second substrate SR2. The first phase difference plate PDS1, the first polarizer plate PR1, the second phase difference plate PDS2, and the second polarizer plate PR2 are each an optical film. In this case, a phase difference compensation amount of the first phase difference plate PDS1 is preferably larger than a phase difference compensation amount of the second phase difference plate PDS2. Each of the resin bases PSR is formed of a resin material, thereby causing a phase shift to occur in light which passes therethrough. In addition, although the first resin base PSR1 and the third resin base PSR3 is located on the side closer to the viewer than the liquid crystal layer LC, only the second resin base PSR2 is located on the opposite side thereof. Accordingly, to compensate for a phase difference with the liquid crystal layer LC as its center, the phase difference compensation amount of the first phase difference plate PDS1 is preferably larger than the phase difference compensation amount of the second plate difference plate PDS2. The phase includes respective phases in an in-plane direction and a thickness direction of the liquid crystal layer LC.

Examples of the resin base can include polyimide, polyamide, polyester, polyacrylic, and polycarbonate. When a case where a material for each of the resin bases PSR is polyimide is taken as an example, the polyimide material causes a negative phase difference, which is large in the thickness direction, for light which passes therethrough. Accordingly, in such a case, the first phase difference plate PDS1 and the second phase difference plate PDS2 each includes a layer which causes a positive phase difference in the thickness direction (e.g., a liquid crystal layer homeotropically aligned). Since there are two polyimide bases on the side closer to the viewer than the liquid crystal layer LC, a phase difference compensation amount in the thickness direction of the first phase difference plate PDS1 is preferably larger than a phase difference compensation amount in the thickness direction of the second phase difference plate PDS2. The first phase difference plate PDS1 and the second phase difference plate PDS2 may each include a plurality of layers which cause a phase difference. The first phase difference plate PDS1 or the second phase difference plate PDS2 may be omitted, and respective compensations of all the phase differences may be performed by one phase difference plate.

The cover member CG such as a glass member is bonded to the display panel PNL with an adhesive layer AM interposed therebetween. An illumination device ID (a backlight) including a light emitting element IE such as a light emitting diode (LED) is adhered on the display panel PNL. The flexible circuit board FPC serving as an external driving circuit is pressure-bonded to a driving region of the first substrate SR1. The display panel PNL, the cover member CG, and the illumination device ID are together referred to as the display device DSP. The display panel PNL may be a reflection type for selectively reflecting light incident on a display surface of the display panel PNL to display an image on the display surface. When the display panel PNL is a reflection type, the illumination device ID may be omitted.

In FIG. 7, the insulating film IF arranged in contact with the first resin base PSR1 and the insulating film IF arranged in contact with the second resin base PSR2 are respectively inorganic insulating films. The inorganic insulating films have a function of blocking gas such as water vapor which has penetrated the resin base. The inorganic insulating film has a function of preventing the resin base from bending by an internal stress generated in the resin base in the processes for manufacturing the display device DSP. The inorganic insulating film may be a single layer or a stacked film. If the inorganic insulating film is a stacked film, the stacked film is preferably obtained by alternately stacking silicon oxide and silicon nitride. The third resin base PSR3 may be provided with such an inorganic insulating film, which is not illustrated.

Figure 2:
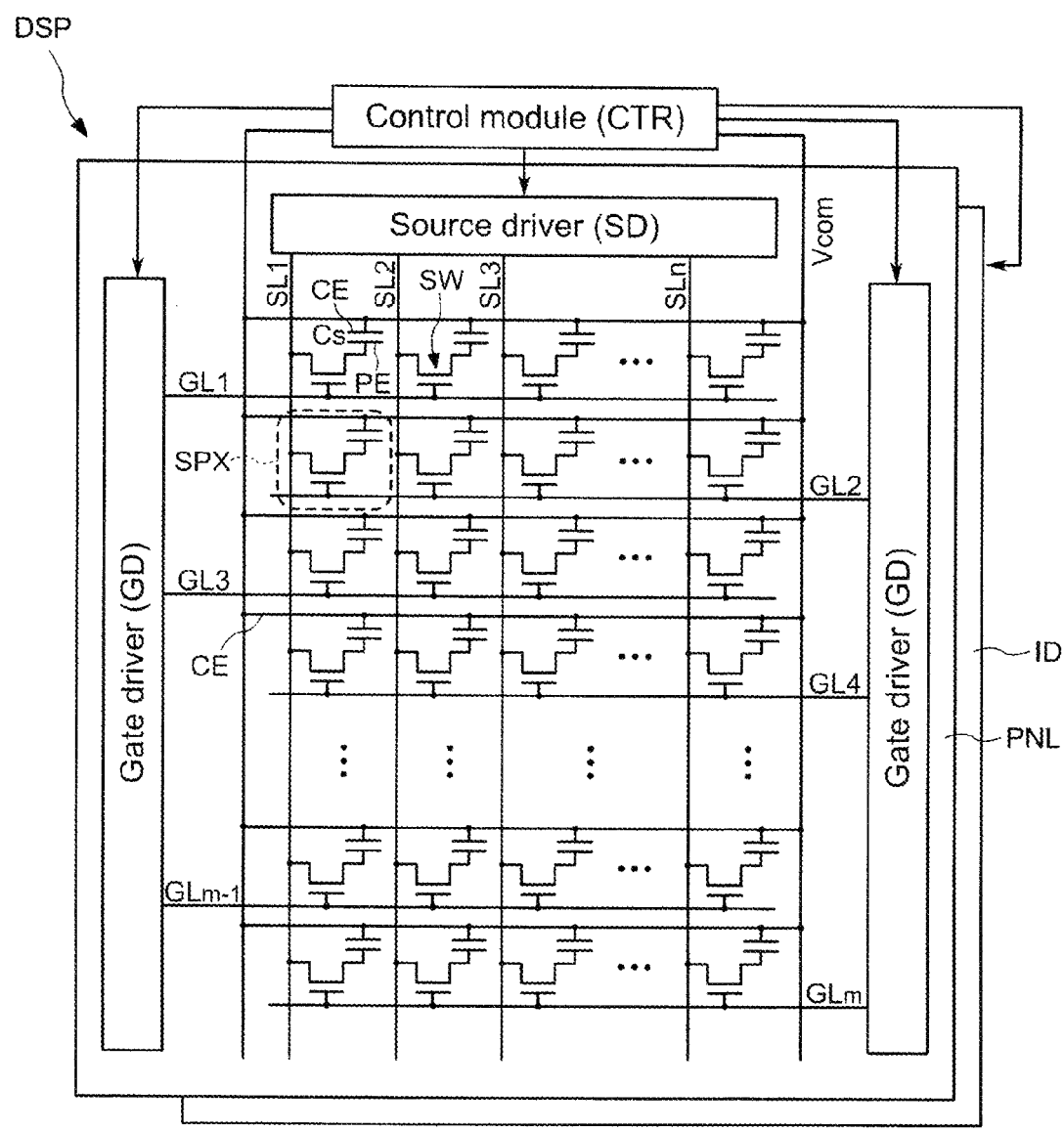
FIG. 2 is a conceptual diagram of a display region in the first embodiment.

FIG. 2 is a planar view illustrating a schematic configuration of the display device DSP which is common among embodiments. As illustrated in FIG. 2, the display device DSP includes the display panel PNL having a display surface and a back surface and the illumination device ID which irradiates light onto the back surface of the display panel PNL, for example.

The display panel PNL includes a control module CTR. The display panel PNL includes the display region DA (see FIG. 5) on which an image is to be displayed in a planar view. A plurality of sub-pixels SPX are arranged in a matrix shape of m rows by n columns in the display region DA. When the three sub-pixels SPX respectively corresponding to red (R), green (G), and blue (B) are combined to constitute a pixel PX, the pixel PX can display a color. The pixel PX may include a sub-pixel SPX in another color such as white, or may include a plurality of sub-pixels SPX in the same color.

The first substrate SR1 includes a plurality of scanning lines GL (GL1, GL2, GL3, ... GLm) and a plurality of video lines SL (SL1, SL2, SL3, ... SLn) respectively intersecting the scanning lines GL in the display region DA. The sub-pixel SPX in the above-described display panel PNL corresponds to a region defined by the adjacent two scanning lines GL and the adjacent two video lines SL.

Each of the sub-pixels SPX in the first substrate SR1 includes a switching element SW and a pixel electrode PE. The switching element SW is composed of a transistor TR, for example, and is electrically connected to the scanning line GL, the video line SL, and the pixel electrode PE. A common electrode CE is facing to the plurality of sub-pixels SPX. The common electrode CE may be provided in the first substrate SR1, or may be provided in the second substrate SR2.

The control module CTR controls a gate driver GD and a source driver SD. The gate driver GD provides a scanning signal to each of the scanning lines GL. The source driver SD provides a video signal to each of the video lines SL. When the scanning signal is provided to the scanning line GL corresponding to the switching element SW, the video signal on the video line SL is provided to the pixel electrode PE. A common potential Vcom is supplied from the control module CTR to the common electrode CE. The pixel electrode PE and the common electrode CE form an electric field between the pixel electrode PE and the common electrode CE, to change an alignment of liquid crystal molecules in the liquid crystal layer LC. A storage capacitor CS is formed between the common electrode CE and the pixel electrode PE, for example.

Figure 3:
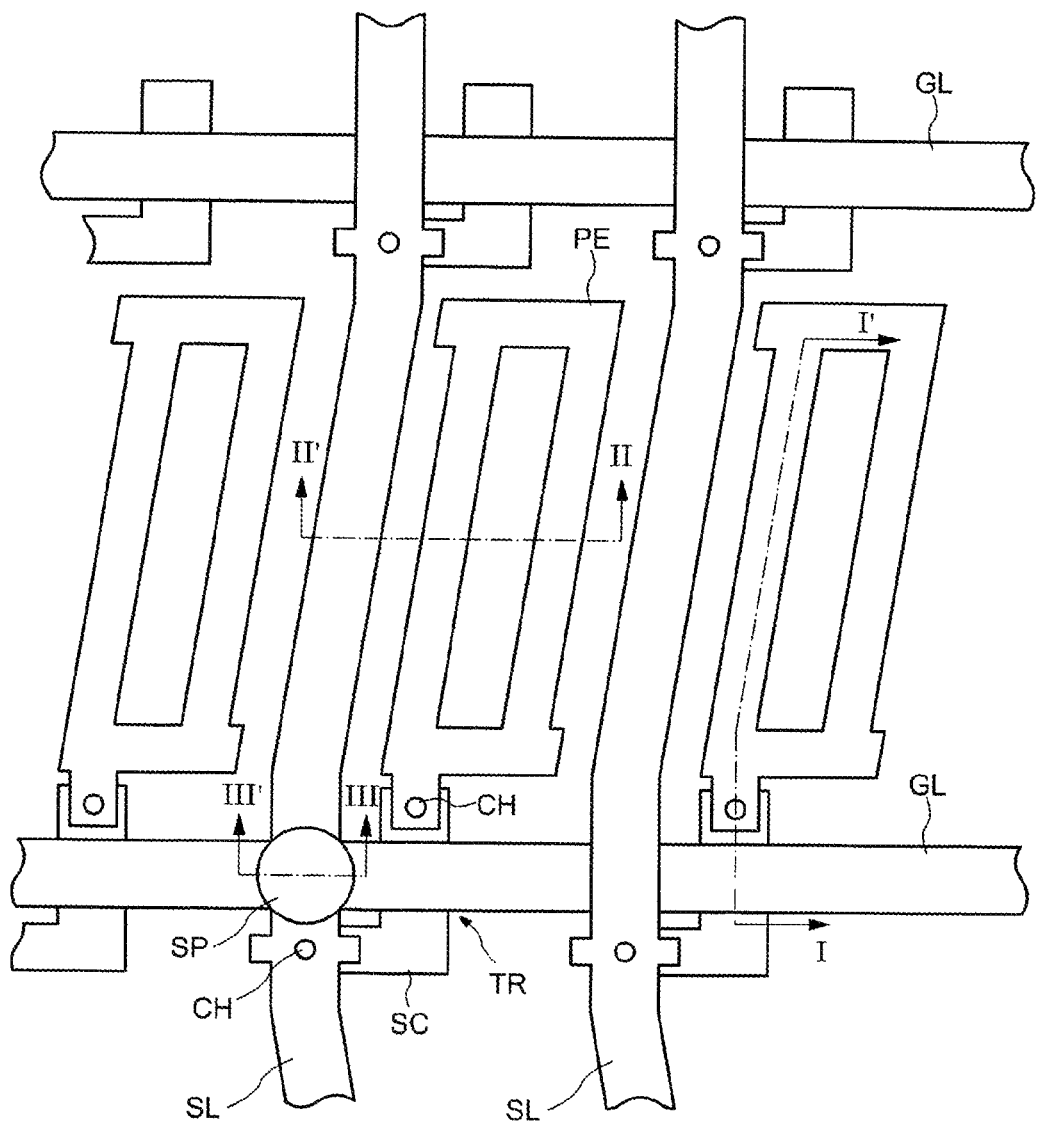
FIG. 3 is a planar view of a sub-pixel region in the first embodiment.
Figure 4:
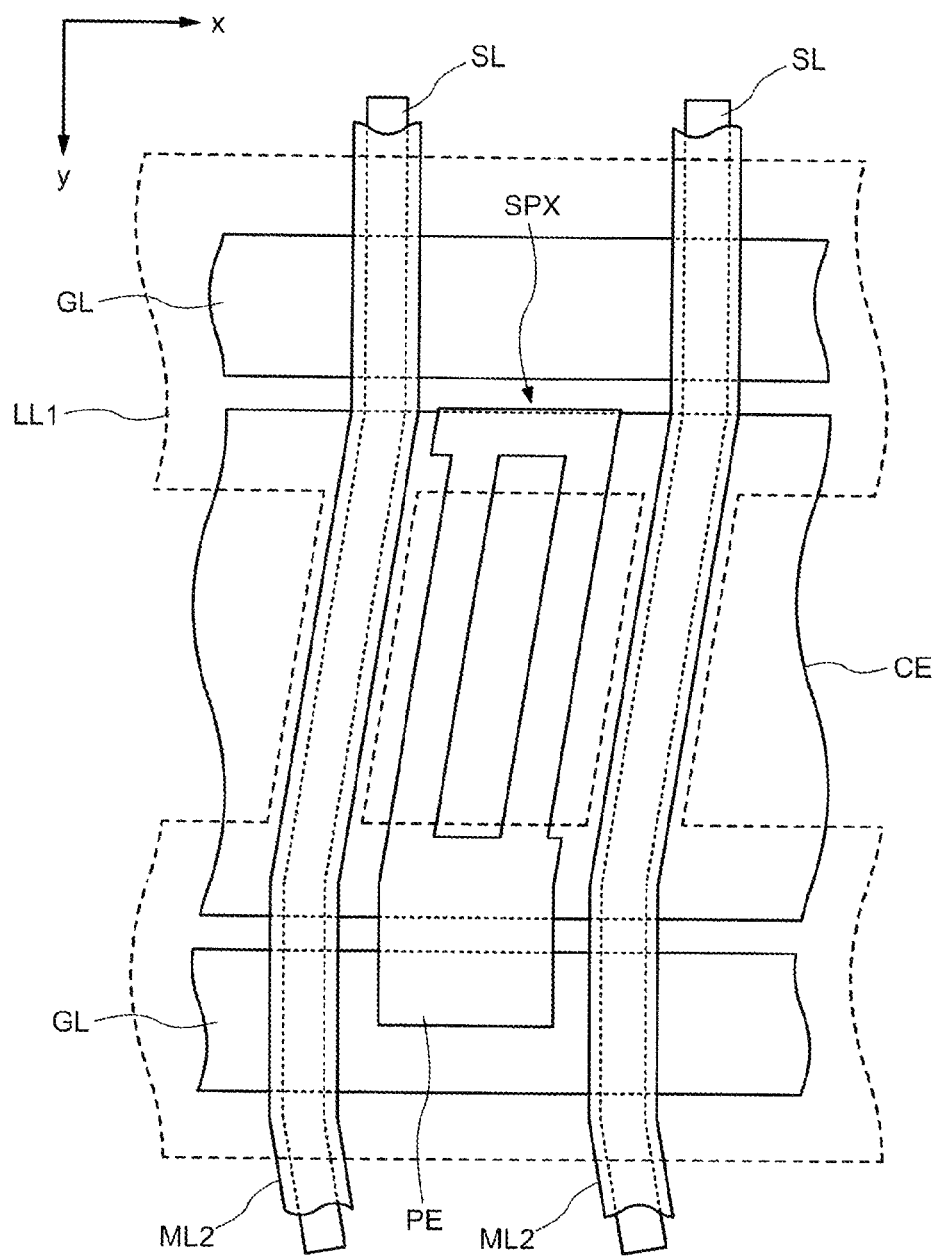
FIG. 4 is a planar view of the sub-pixel region in the first embodiment.

FIGS. 3 and 4 are planar views each illustrating a configuration of the sub-pixels SPX in the first substrate SR1 illustrated in FIG. 2. As illustrated in FIG. 3, the transistor TR includes a semiconductor layer SC, a source electrode, and a drain electrode. The semiconductor layer SC is connected to the video line SL and the pixel electrode PE via a contact holes CH. While the transistor TR illustrated in FIG. 3 is a single-gate transistor TR in which the semiconductor layer SC intersects the scanning line GL once, the transistor TR may be a double-gate transistor TR in which the semiconductor layer SC intersects the scanning line GL two times. Examples of a material for the semiconductor SC can include amorphous silicon, polysilicon (polycrystalline silicon), and an indium gallium zinc oxide. A structure of the transistor TR may be of a bottom-gate type or a top-gate type.

FIG. 4 illustrates a relationship between the video lines SL and second metal wirings ML2 connected to the common electrode CE. The display panel PNL adopts an FFS (Fringe Field Switching) type. The pixel electrode PE is in a shape having a slit. The pixel electrode PE forms a horizontal electric field between the pixel electrode PE and the common electrode CE illustrated in FIG. 4. Some of liquid crystal molecules rotate by the electric field, and light is transmitted from an opening of a first light shielding film LL1. The spacer SP is formed to overlap an intersection between the scanning line GL and the video line SL in the first substrate SR1. As illustrated in FIG. 8B, described below, the second metal wiring ML2 is stacked on the common electrode CE, and overlaps the video line SL. The second metal wiring ML2 extends along a direction in which the video line SL extends (a Y direction illustrated in FIG. 4). The second metal wiring ML2 is arranged in a direction in which the video lines SL are arranged (an X direction illustrated in FIG. 4). The second metal wiring ML2 reduces a resistance of the common electrode CE.

Figure 5:
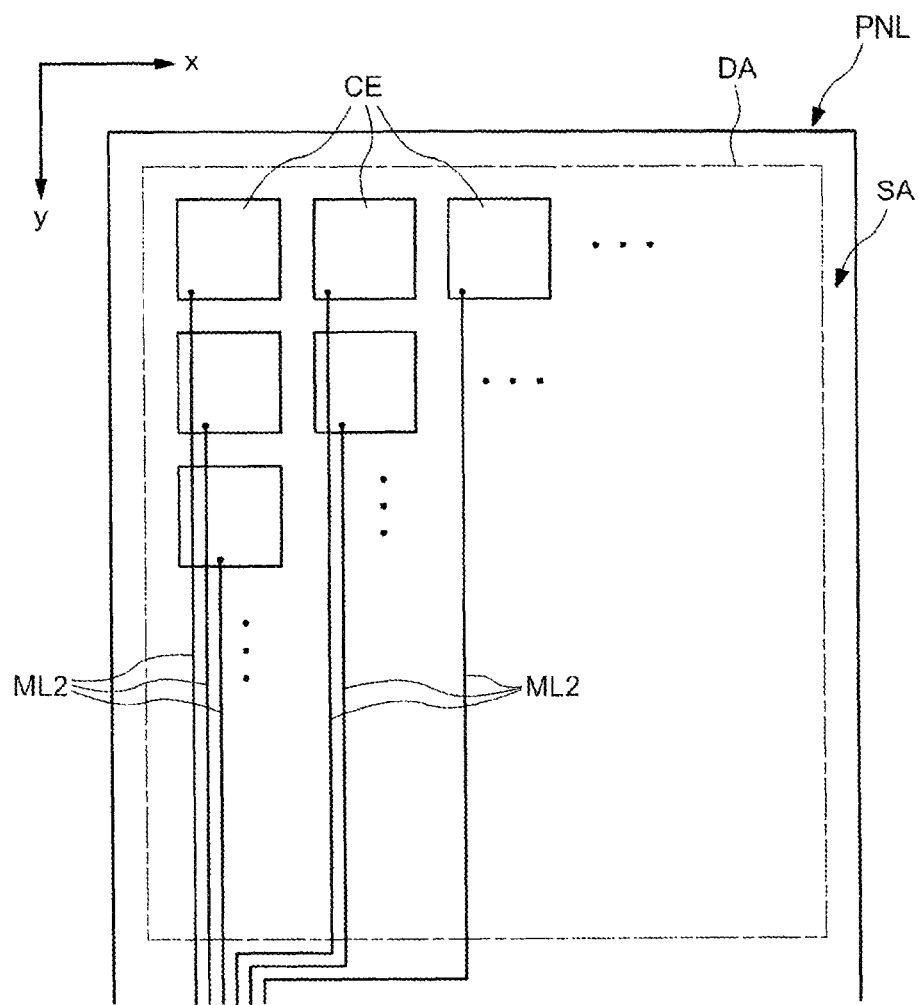
FIG. 5 is a conceptual diagram of a common electrode in a modification to the first embodiment.

As illustrated in FIG. 5, the second metal wiring ML2 is not limited to a structure in which it is stacked on the common electrode CE. The common electrode CE illustrated in FIG. 5 includes a plurality of common electrode elements separated from each other. The plurality of common electrode elements are arranged in the first direction X and the second direction Y, and are respectively connected to the different second metal wirings ML2. Each of the common electrode elements also functions as a self-capacitance detection electrode. A common potential and a detection potential are supplied in a time-divisional manner to each of the common electrode elements. The common electrode CE includes each of the common electrode elements in FIG. 5.

Figure 6:
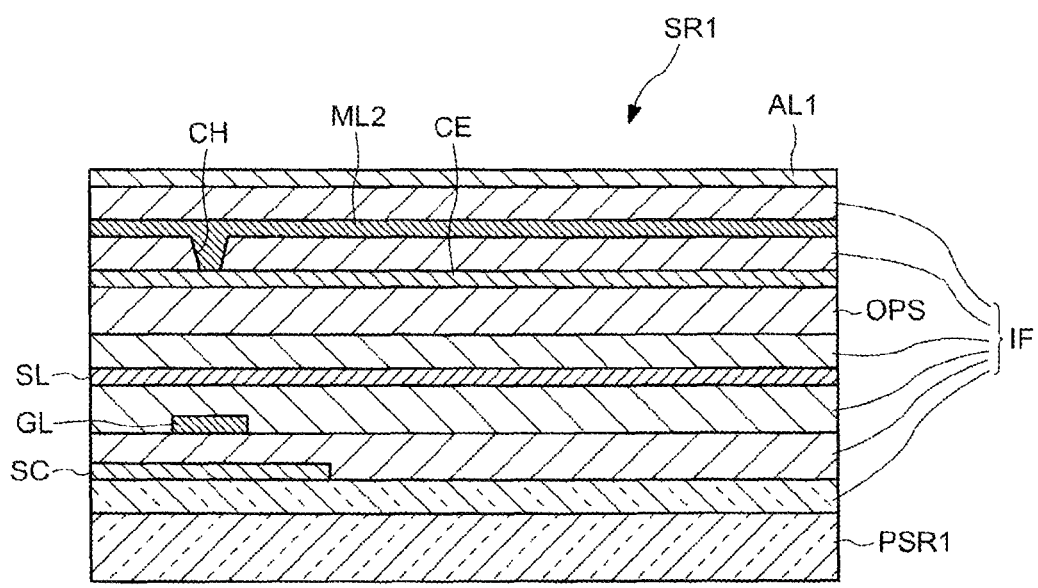
FIG. 6 is a cross-sectional view of the common electrode in the modification to the first embodiment.

FIG. 6 is a cross-sectional view including the second metal wiring ML2 illustrated in FIG. 5. The second metal wiring ML2 is similar to that illustrated in FIG. 4 in that it extends along a direction in which the video line SL extends and is connected to the common electrode CE. The second metal wiring ML2 illustrated in FIG. 6 has two differences from the second metal wiring ML2 illustrated in FIG. 4. The first difference is that the second metal wiring ML2 illustrated in FIG. 6 is arranged on the common electrode CE with the insulating film IF interposed therebetween. The second difference is that the second metal wiring ML2 and the common electrode CE are connected to each other with an opening at a position overlapping the intersection between the scanning line GL and the video line SL interposed therebetween.

FIG. 7 is a cross-sectional view along a one-dot and dash line I-I' illustrated in FIG. 3. The third substrate SR3 is bonded to the first substrate SR1 with the adhesive layer AD interposed therebetween, as illustrated in FIG. 1. The second substrate SR2 faces to the first substrate SR1 with the liquid crystal layer LC interposed therebetween. The third substrate SR3 includes the color filter CF. The second substrate SR2 includes the insulating film IF and a second alignment film AL2. The first substrate SR1 includes the circuit layer CR, the pixel electrode PE, the common electrode CE, and a first alignment film AL1. As illustrated in FIG. 7, the circuit layer CR includes the semiconductor SC, the source/drain electrode SD, the scanning line GL, a second light shielding film LL2, the insulating film IF, and an organic flattening film OPS. The organic flattening film OPS relaxes a step caused by the transistor TR, to flatten a surface where the common electrode CE and the pixel electrode PE are formed. The second light shielding film LL2 prevents light from the illumination device ID incident from the side of the second substrate SR2 from being incident on the semiconductor SC.

Figure 8A:
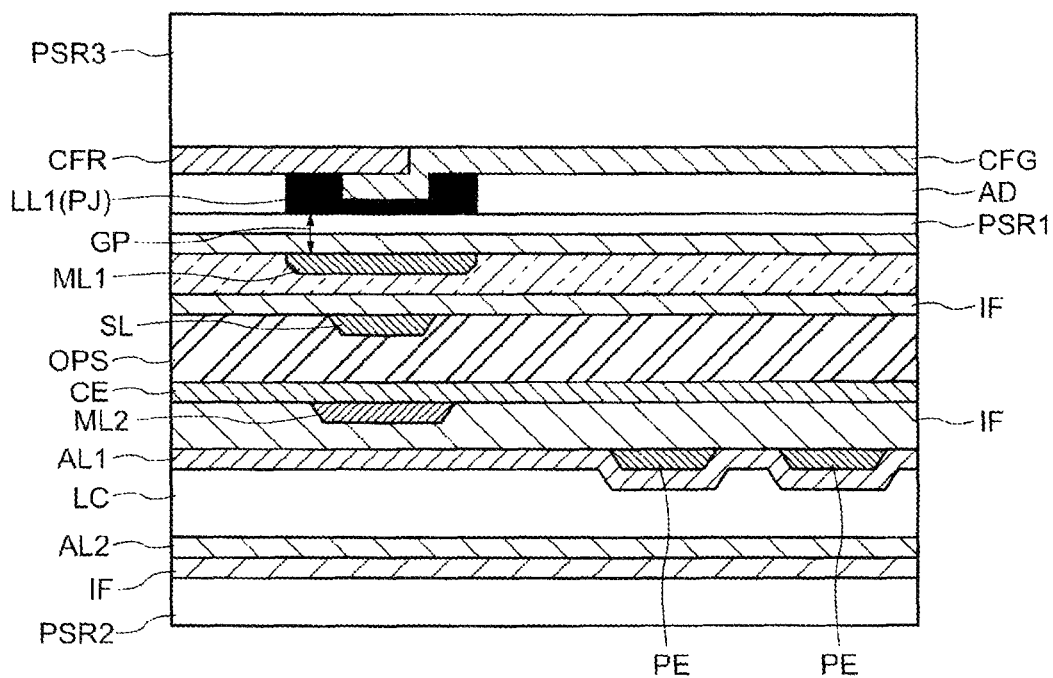
FIG. 8A is a cross-sectional view along a line II-II' in FIG. 3.
Figure 8B:
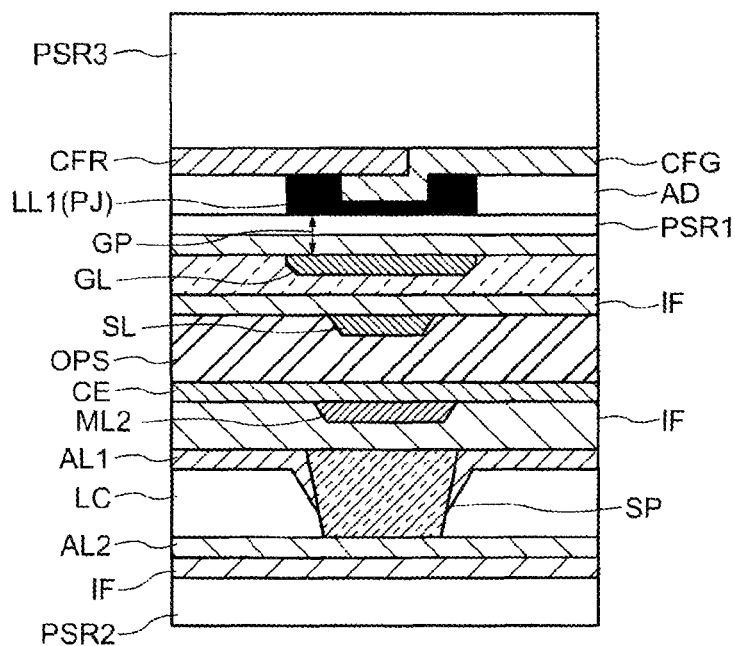
FIG. 8B is a cross-sectional view along a line III-III' in FIG. 3.

FIG. 8A is a cross-sectional view along a one-dot and dash line II-II' illustrated in FIG. 3. FIG. 8B is a cross-sectional view along a one-dot and dash line III-III' illustrated in FIG. 3. As illustrated in FIG. 8A, the color filter CF includes a red color filter layer CFR and a green color filter layer CFG. Both the color filter layers overlap each other at a position where these color filter layers overlap the video line SL. The first light shielding film LL1 is formed in a step portion formed by the two color filter layers overlapping each other. The red color filter layer CFR, the green color filter layer CFG, and the first light shielding film LL1 form a protrusion PJ. The thickness of the adhesive layer AD is defined by the height of the protrusion PJ.

In the present invention, a gap GP between the first light shielding film LL1 and a light shielding member (a metal wiring ML1 in FIG. 8A) closest to the first resin base PSR1 among one or more light shielding members provided in the first substrate SR1 is important, as described below. When the protrusion PJ is formed by the first light shielding film LL1, the thickness of the adhesive layer AD between the first resin base PSR1 and the first light shielding film LL1 can be made significantly small. As a result, the gap GP can be narrowed. The first metal wiring ML1 is a metal material in the same layer as that of the scanning line GL in FIG. 4. The first metal wiring ML1 and the scanning line GL may be integrally formed.

In FIG. 8B, a spacer SP is formed at an intersection between the video line SL and the scanning line GL (in the same layer as that of the first metal wiring ML1 in FIG. 8A). The spacer SP defines the thickness of the liquid crystal layer LC. The protrusion PJ having the first light shielding film LL1 as its apex may be formed as a spacer, like in FIG. 8A, on the first light shielding film LL1. In this case, the apex of the protrusion PJ functions as a spacer, and the thickness of the adhesive layer AD can be adjusted by the height of the spacer.

If a shift in position between substrates has occurred in the manufacturing processes, the spacer SP in the first substrate SR1 may cut the second alignment film AL2 in the second substrate SR2. In consideration of this, the second alignment film AL2 may be a rubbing alignment film having a high frictional strength aligned with a rubbing cloth. Since no spacer SP exists in the second substrate SR2, the rubbing cloth can be applied to the entire alignment film. On the other hand, to sufficiently perform alignment processing up to the first alignment film AL1 in the vicinity of the spacer SP, a photo-alignment film for which alignment processing is performed using ultraviolet light is preferably used as the first alignment film AD.

Figure 9:
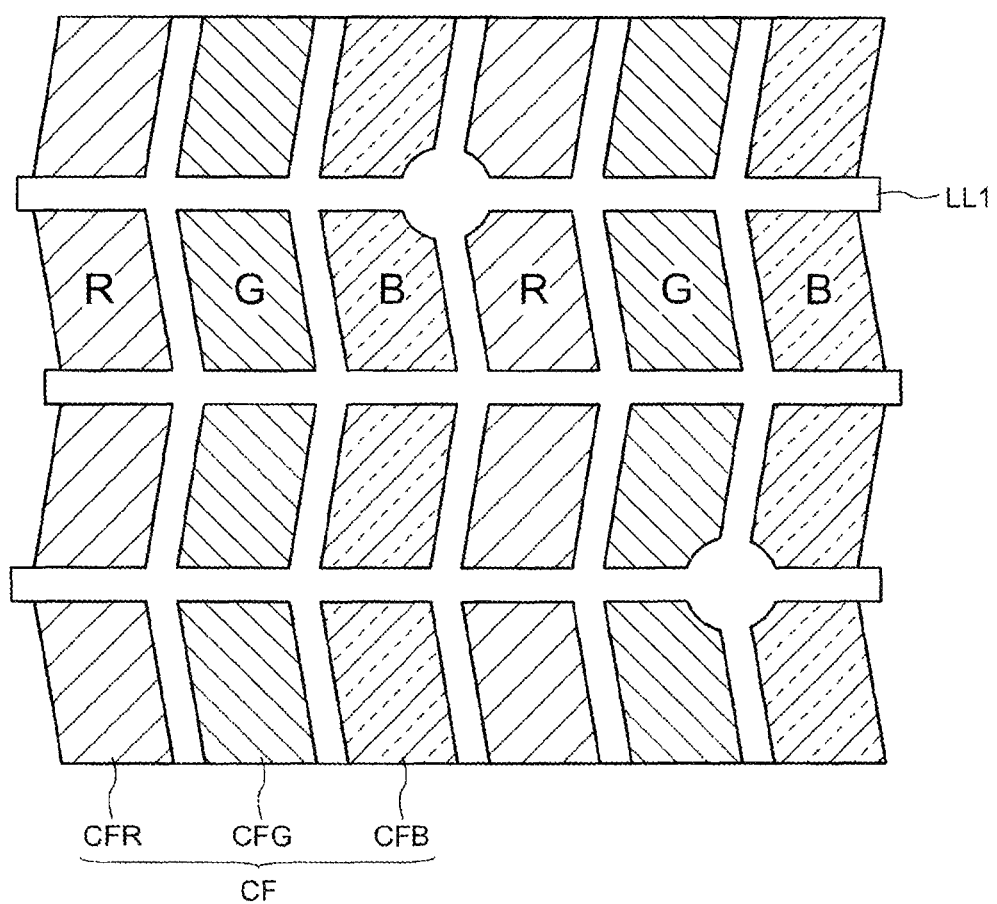
FIG. 9 is a planar view of a third substrate in the first embodiment.

FIG. 9 is a planar view of the third substrate SR3. The color filter CF includes a red color filter layer CFR, a green color filter layer CFG, and a blue color filter layer CFB. Each of the color filter layers extends in one direction while being bended to correspond to a sub-pixel region of the first substrate SR1. The first light shielding film LL1 arranged in a matrix shape is formed in boundaries among the color filter layers. The first light shielding film LL1 defines sub-pixel regions (symbols R, G, and B) of the color filter CF. That is, the first light shielding film LL1 is located between the red color filter layer CFR and the green color filter layer CFG in a planar view. The first light shielding film LL1 arranged at a position overlapping with the spacer illustrated in FIG. 3 is formed to be larger than the first light shielding film LL1 in other regions.

Figure 10:
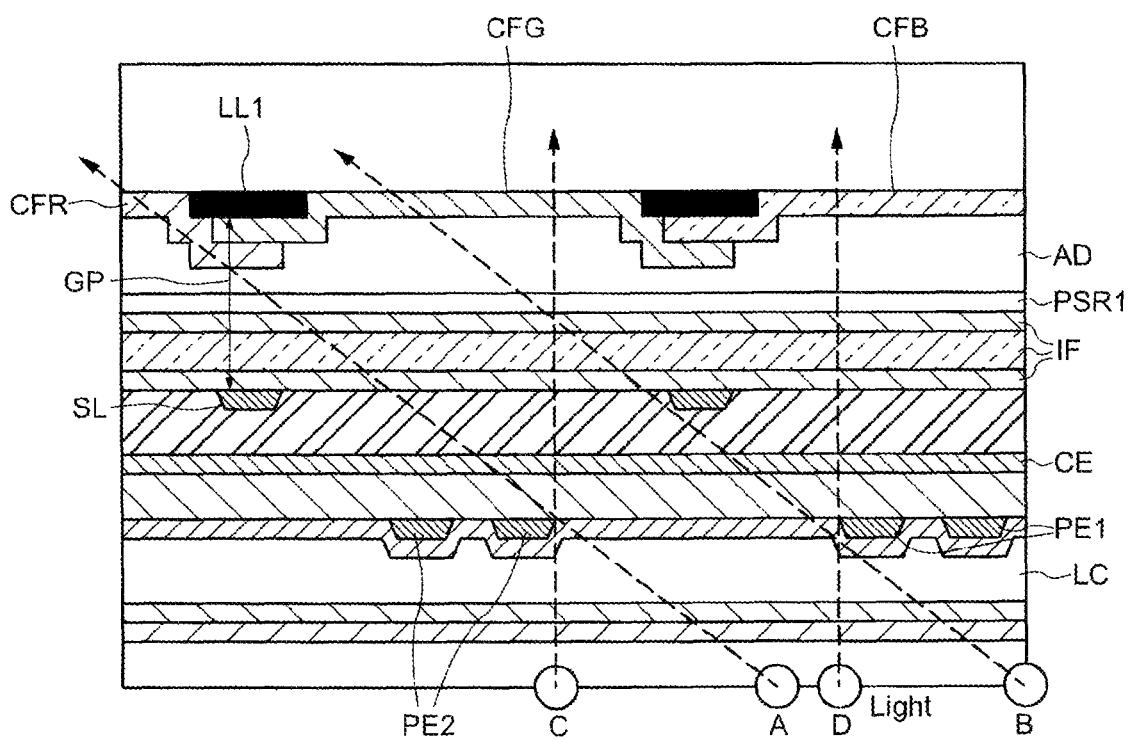
FIG. 10 is a cross-sectional view illustrating an issue of a mixture of colors by light in the first embodiment.

FIG. 10 is a cross-sectional view illustrating a mixture of colors by light, which is a sub-issue of the present invention. In the display device DSP, when liquid crystal molecules are rotated using the pixel electrode PE corresponding to each of the color filters, light from a light source is prevented from being transmitted by the color filter CF adjacent to the color filter CF corresponding to the pixel electrode PE as much as possible. If light has passed through the adjacent color filter CF, an unintended color is also simultaneously developed (hereinafter referred to as a mixture of colors by light). The display quality of an image deteriorates by the mixture of colors by light. A color shift phenomenon in which a color different from an original color is visually recognized may occur depending on a viewing angle.

To prevent a mixture of colors by light, a gap GP between the first light shielding film LL1 formed in the third substrate SR3 and the light shielding member (the video line SL in FIG. 10) closest to the first resin base PSR1 among the one or more light shielding members formed in the first substrate SR1 is important. The reason is that the color filter CF and the first light shielding film LL1 are formed in the third substrate SR3 in the present embodiment. For example, the thinned adhesive layer AD, the first resin base PSR1, and the three-layer insulating film IF are located between the first light shielding film LL1 and the video line SL in FIG. 10. That is, the gap GP in the display panel PNL illustrated in FIG. 10 easily becomes very long, and light, which passes through the gap GP, easily increases.

For example, light, which has been incident on the liquid crystal layer LC at an angle of 45° from a position of a circle A, passes through a region of the liquid crystal layer LC corresponding to the green color filter layer CFG, and passes through the red color filter layer CFR. That is, if liquid crystal molecules are rotated using the pixel electrode PE2, green light (light incident on the liquid crystal layer LC at an angle of 90° from a position of a circle C) and red light simultaneously develop respective colors, and thus a mixture of colors by light occurs. Light, which has been incident on the liquid crystal layer LC at an angle of 45° from a position of a circle B, passes through a region of the liquid crystal layer LC corresponding to the blue color filter layer CFB, and passes through the green color filter layer CFG. That is, if liquid crystal molecules are rotated using the pixel electrode PE1, green light and blue light (light incident on the liquid crystal layer LC at an angle of 90° from a position of a circle D) simultaneously develop respective colors, and thus a mixture of colors by light occurs.

Figure 11:
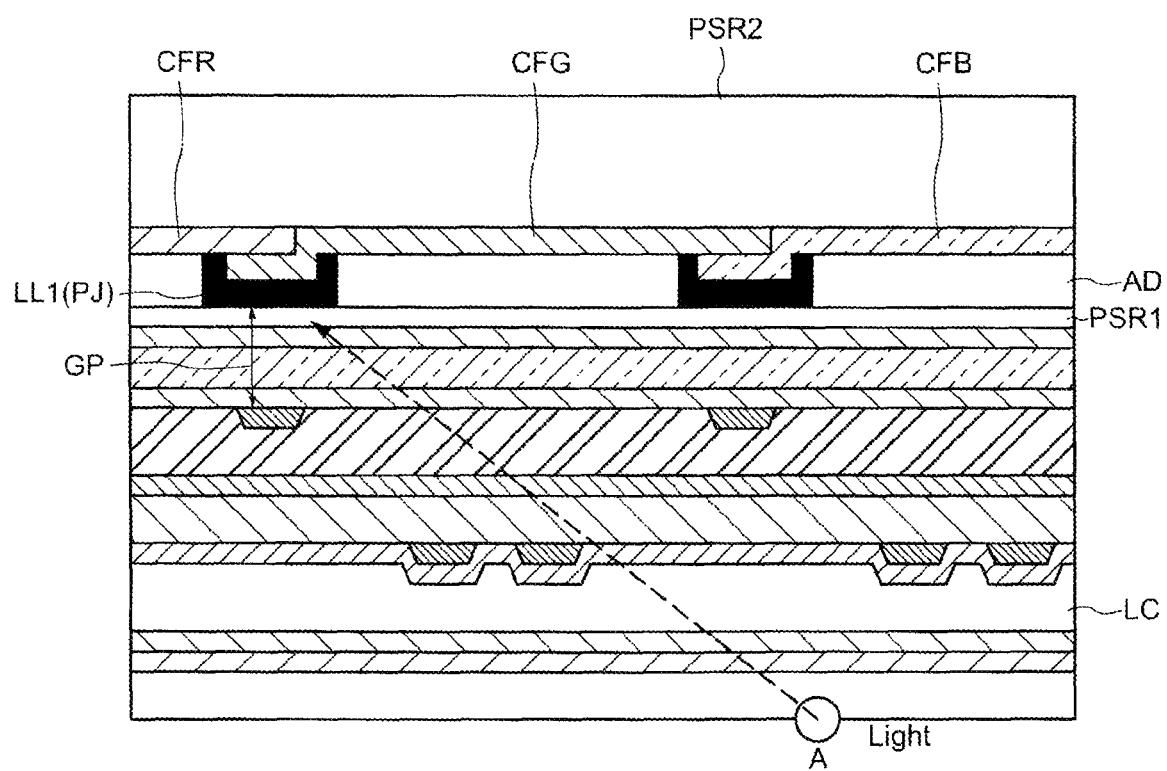
FIG. 11 is a cross-sectional view illustrating a solution to the issue illustrated in FIG. 10.
Figure 12:
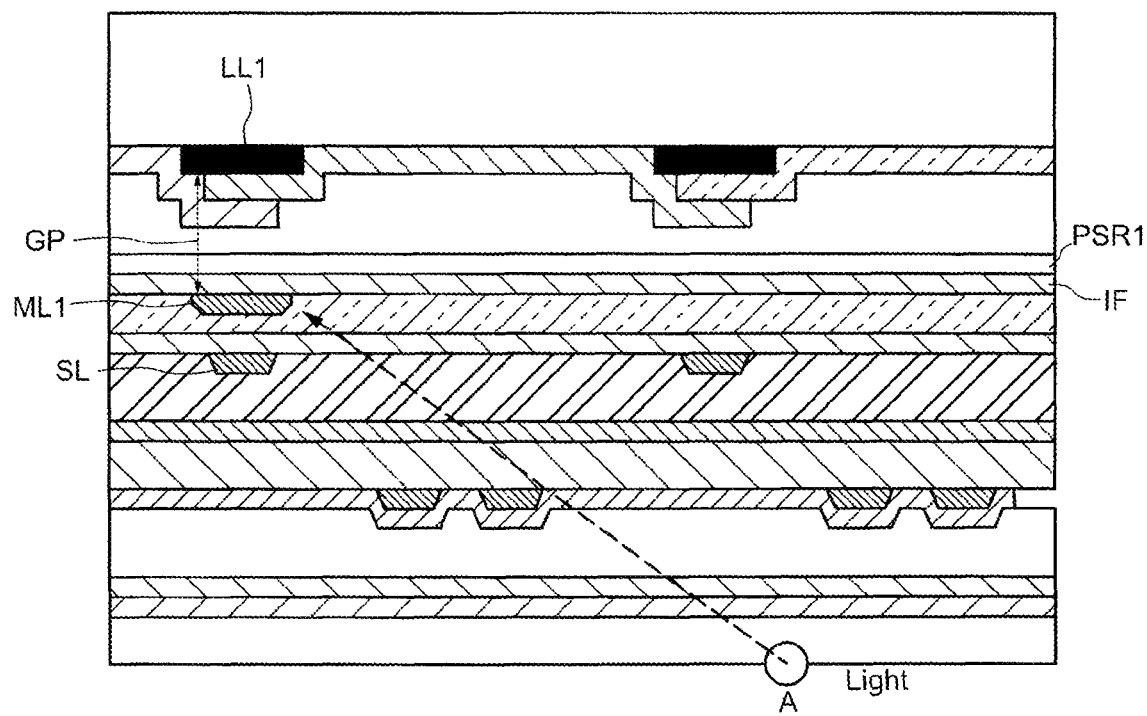
FIG. 12 is a cross-sectional view illustrating a solution to the issue illustrated in FIG. 10.
Figure 24:
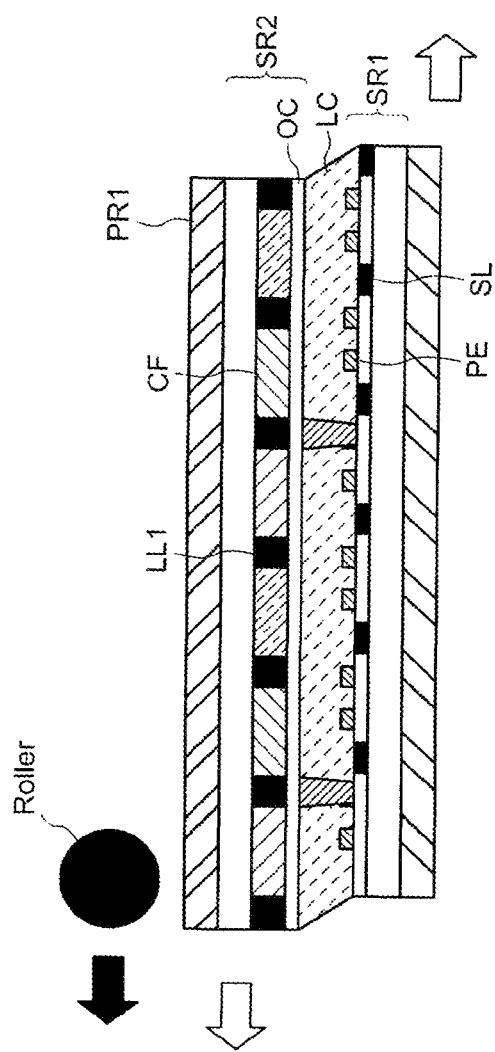
FIG. 24 is a cross-sectional view illustrating an issue of a shift in position between substrates in a conventional technique.
Figure 25:
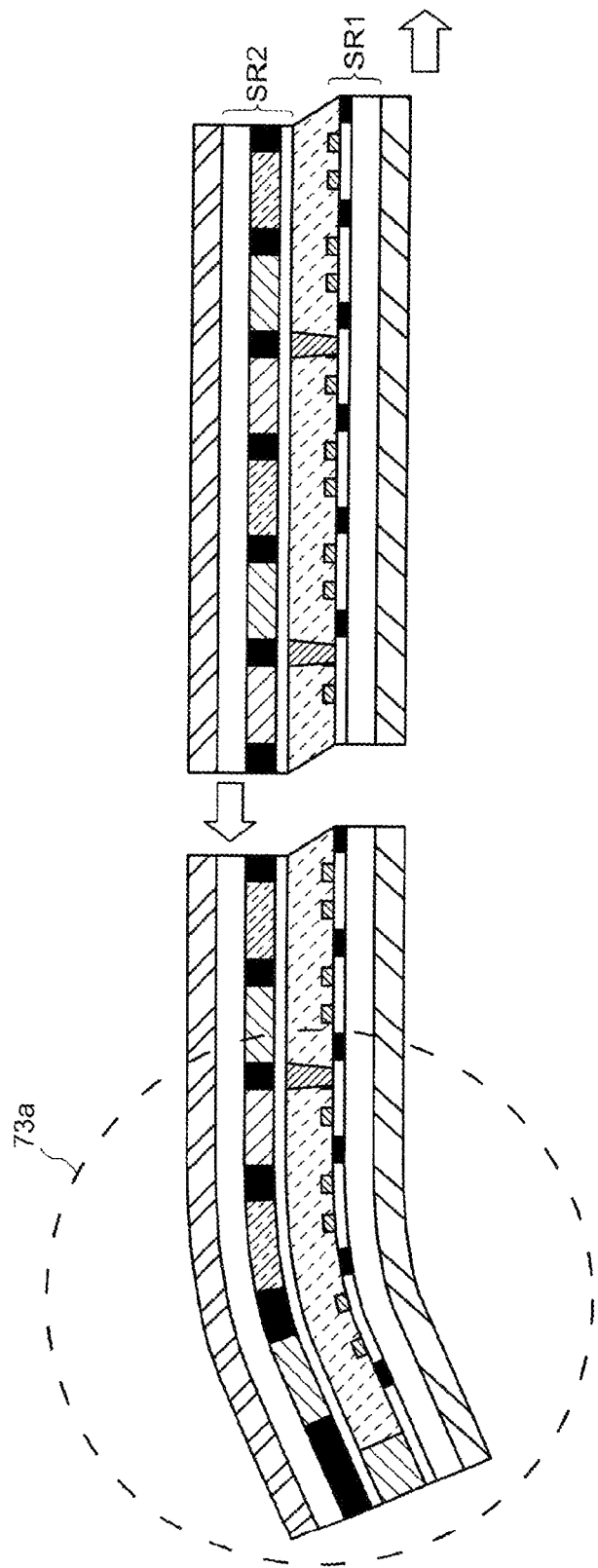
FIG. 25 is a cross-sectional view illustrating an issue of a shift in position between substrates in a conventional technique.

FIGS. 11 and 12 respectively illustrate examples in which a mixture of colors by incident light from a position of the circle A is prevented. In a conventional technique as illustrated in FIG. 24, for example, a first light shielding film LL1 is formed in the same layer as that of a color filter CF in a substrate in which the color filter CF is formed. When respective materials for the color filter CF and the first light shielding film LL1 contact the liquid crystal layer LC, the liquid crystal layer LC is contaminated. Therefore, both the color filter CF and the first light shielding film LL1 are covered with an overcoat layer OC. Further, the overcoat layer OC also has a function of protecting the color filter CF and the first light shielding film LL1.

On the other hand, in this example, the first light shielding film LL1 is arranged at a position closer to a first substrate SR1 than the color filter CF. A third substrate SR3 does not include the overcoat layer OC because it does not contact a liquid crystal layer LC and the color filter CF, for example. An adhesive layer AD has a function of bonding the substrates and a function of coating the color filter CF and the first light shielding film LL1 (see FIG. 12). A protrusion PJ is formed using the color filter CF and the first light shielding film LL1, to form the adhesive layer AD thinner. When a distance between the color filter CF and a first resin base PSR1 is narrowed with these devices, a gap GP can be made narrower than that illustrated in FIG. 10. As a result, incident light from a position of the circle A in each of FIGS. 11 and 12 can be blocked by the light shielding film LL1.

In FIG. 12, a first metal wiring ML1 is arranged between a video line SL and a first resin base PSR1, unlike in FIG. 10. The first metal wiring ML1 is made of a material in the same layer as that of a scanning line GL, as described above. The first metal wiring ML1 is a light shielding film which defines the above-described gap GP. That is, an area between the first light shielding film LL1 and the first metal wiring ML1 corresponds to the gap GP. Accordingly, the gap GP illustrated in FIG. 12 can be made narrower than the gap GP illustrated in FIG. 10, and a mixture of colors by light incident from the position of the circle A can be prevented. Since the width of the first metal wiring ML1 is larger than the width of the video line SL, a performance of preventing a mixture of colors by light can be improved. Since the width of the video line SL is smaller than the width of the first metal wiring ML1, a capacitive coupling between the video line SL and the adjacent video line SL can be suppressed.

Figure 13:
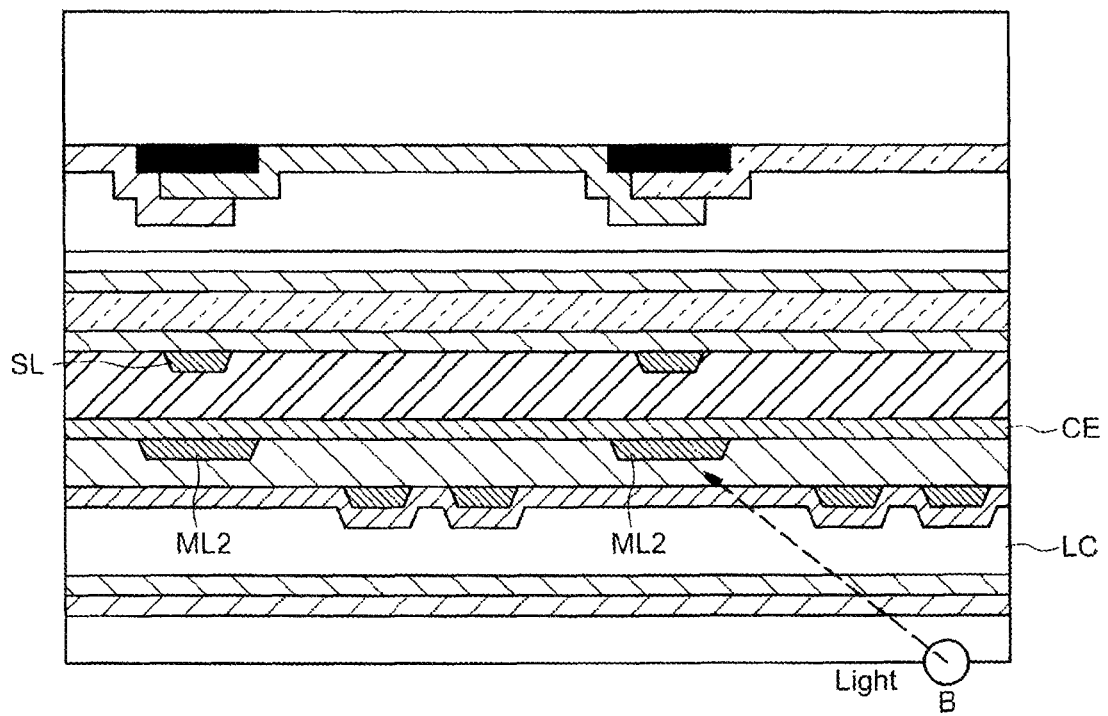
FIG. 13 is a cross-sectional view illustrating a solution to the issue illustrated in FIG. 10.

FIG. 13 illustrates an example in which a mixture of colors by light incident from a position of a circle B is prevented. In FIG. 13, a second metal wiring ML2 is arranged to be connected to a common electrode CE, like in FIG. 6. When the second metal wiring ML2 is arranged in addition to a video line SL, a mixture of colors by light incident from the position of the circle B is prevented. Since the width of the second metal wiring ML2 is larger than the width of the video line SL, a light shielding effect can be improved.

Respective parameters of the display device DSP and the members for preventing a mixture of colors by light will be described below. Panels 1 to 4 illustrated in Table 1 are each a panel in which the thickness of each of the members has been changed and a panel in which some of wirings are omitted with the cross-sectional view of FIG. 8A as a model. A display device 1 in Table 1 is a display device having a 10-inch HD (High Definition) resolution (1280:720=resolution on scanning line side:resolution on video line side). The screen resolution of the display device 1 is approximately 150 ppi, and the width of a sub-pixel region is approximately 60 μm. A display device 2 is a display device having a 6-inch HD resolution. The screen resolution of the display device 2 is approximately 250 ppi, and the width of a sub-pixel region is approximately 35 μm. The display device 3 is a display device having a 5.5-inch full HD resolution (1920:1080=resolution on scanning line side:resolution on video line side). The screen resolution of the display device 3 is approximately 400 ppi, and the width of a sub-pixel region is approximately 21 μm. The display device 1 corresponds to a tablet PC or an in-vehicle display. The display devices 2 and 3 each correspond to a smartphone.

When each of the display panels 1 to 4 is applied to any one of the display devices 1 to 3, it is simulated whether a mixture of colors by light can be prevented. A simulation result is illustrated in Table 1. In Table 1, "OK" indicates that the possibility of preventing a mixture of colors is high, and "NG" indicates that the possibility of preventing a mixture of colors is low.

TABLE 1

|  | Panel 1 | Panel 2 | Panel 3 | Panel 4 |
| --- | --- | --- | --- | --- |
| Thickness (μm) of first resin base PSR1 | 10 | 7 | 6 | 4 |
| Thickness (μm) of adhesive layer AD | 20 | 2 | 2 | 2 |
| Gap GP (μm) | 31.5 | 10.5 | 8.5 | 6.5 |
| Presence or absence of first metal wiring ML1 | Absence | Absence | Presence | Presence |
| Presence or absence of second metal wiring ML2 | Absence | Presence | Absence | Presence |
| Display device 1 (HD tablet PC) | NG | OK | OK | OK |
| Display device 2 (HD smartphone) | NG | NG | OK | OK |
| Display device 3 (Full HD smartphone) | NG | NG | NG | OK |

From the above-described result in Table 1, the panel 1 in which the first resin base PSR1 and the adhesive layer AD are relatively thick is not easily applied to any one of the display devices 1 to 3 because the gap GP becomes large. The thickness 20 μm of the adhesive layer AD in the panel 1 is a general thickness of an adhesive layer used for bonding a polarizer plate in a display device. The panel 2 in which the gap GP is narrower than that in the panel 1 and the second metal wiring ML2 is provided may be applied to the display device 1. The panel 3 in which the gap GP is narrowed to 8.5 μm and the first metal wiring ML1 is provided may be applied to the display devices 1 and 2. The panel 4 in which the gap GP is narrowed to 6.5 μm and the first metal wiring ML1 and the second metal wiring ML2 are provided may be applied to the display devices 1 to 3.

From the above-described result in Table 1, the total of the respective thicknesses of the first resin base PSR1 and the adhesive layer AD is preferably 18 μm or less, further preferably 14 μm or less, more preferably 9.5 μm or less, and still more preferably 8.5 μm or less. The lower limit of the thickness of the total is preferably 4 μm or more to cause each of the members to have a sufficient strength. The gap GP between the first light shielding film LL1 and the light shielding member closest to the first resin base PSR1 among the one or more light shielding members provided in the first substrate SR1 is preferably 20 μm or less, further preferably 15 μm or less, more preferably 10 μm or less, and still more preferably 8 μm or less. The thickness of the first resin base PSR1 is preferably made smaller than the respective thicknesses of the second resin base PSR2 and the third resin base PSR3. Considering a mixture of colors by light, the upper limit of the screen resolution of the display device is preferably 450 ppi or less. Letting S be the width of the sub-pixel region in the display device and d be the thickness of the first resin base PSR1, S/d is preferably designed to be in a range of 0.5 or more and 2.0 or less from the viewpoint of prevention of a mixture of colors and a strength of the display panel.

In the above-described embodiment, a display panel which is driven by an FFS mode driving type serving as one type of horizontal electric field type has been used. However, the display panel according to the present embodiment is not limited to the above-described display panel, but may be a display panel which is driven by a TN (Twisted Nematic) mode or VA (Vertical Aligned) mode driving type, for example. Although the display panel, which is driven by the TN mode or VA mode driving type, includes a common electrode in a second substrate SR2, the common electrode has a substantially planar shape formed to be common over each of sub-pixel regions. Accordingly, even if a shift in position between the first substrate SR1 and the second substrate SR2 occurs, problem of deterioration in display quality does not occur.

However, if the display device has a touch detection function within a liquid crystal cell of a display panel, when a shift in position between substrates is considered, an electrode for detection is to be formed in the first substrate SR1 or the third substrate SR3. That is, if a common electrode has a function of an electrode for detection, as described above, the display panel preferably adopts a horizontal electric field type in which a pixel electrode and the common electrode are formed in the first substrate SR1.

(Method for Manufacturing Display Panel)

Figure 14:
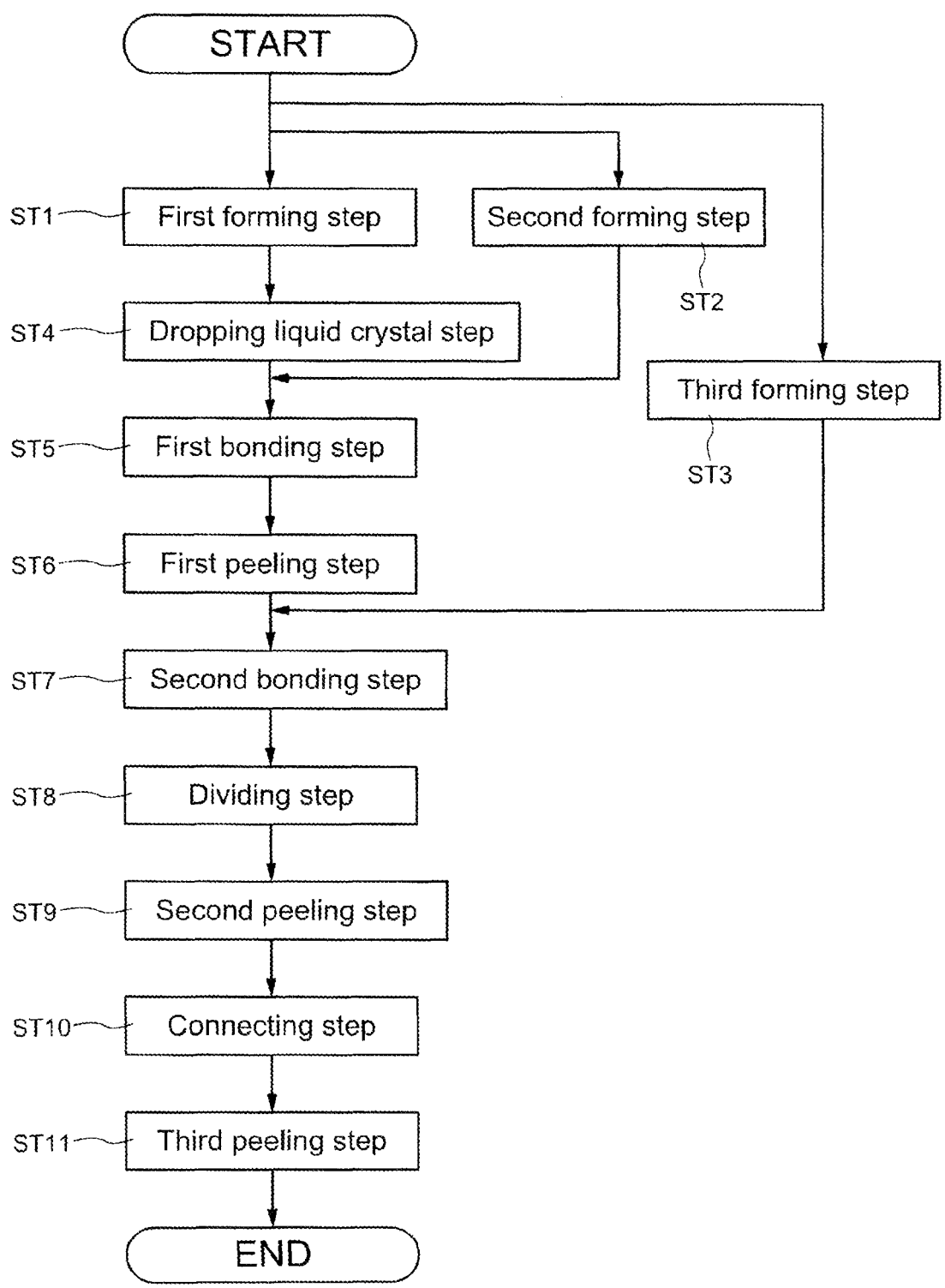
FIG. 14 is a flowchart illustrating the order of steps in a method for manufacturing a display panel according to the first embodiment.

A method for manufacturing the display panel PNL described in the first embodiment will be described below with reference to FIG. 14. First, steps ST1 to ST3 will be described. First, a material for a first resin base PSR1 is applied to an upper surface of a first rigid substrate RSR1 made of glass or the like, and the applied material is cured, to form the first resin base PSR1. Then, members such as a circuit layer CR, a pixel electrode PE, a spacer SP, and a first alignment film AL1 are formed using photolithography, sputtering, or the like (a first forming step ST1). A first precursor substrate MS1 (a first mother substrate) is obtained by the step ST1.

Then, a material for a second resin base PSR2 is applied to an upper surface of a second rigid substrate RSR2 made of glass or the like, and the applied material is cured, to form the second resin base PSR2. Then, an insulating film IF and a second alignment film AL2 are formed (a second forming step ST2), like in the first forming step ST1. A second precursor substrate MS2 (a second mother substrate) is obtained by the step ST2. Then, a material for a third resin base PSR3 is applied to an upper surface of a third rigid substrate RSR3 made of glass or the like, and the applied material is cured, to form the third resin base PSR3. Then, a color filter CF and a first light shielding film LL1 are formed using photolithography (a third forming step ST3), like in the first forming step ST1. A third precursor substrate (a third mother substrate) is obtained by the step ST3.

Figure 15A:
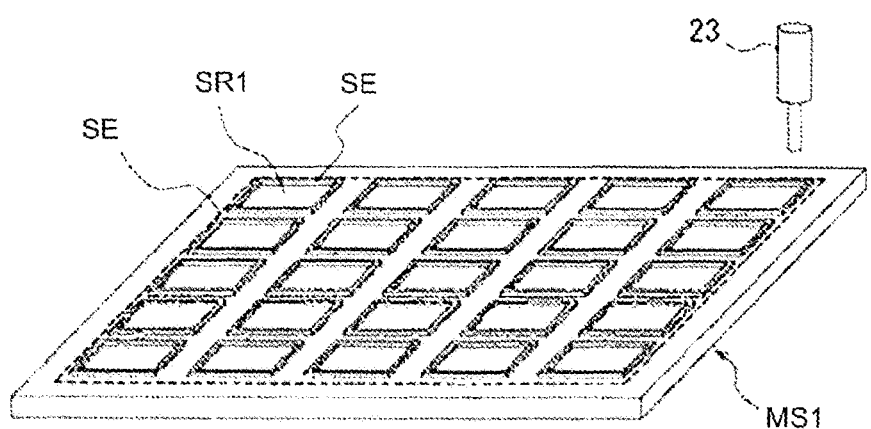
FIG. 15A is a perspective view illustrating a step ST4 in FIG. 14.
Figure 15B:
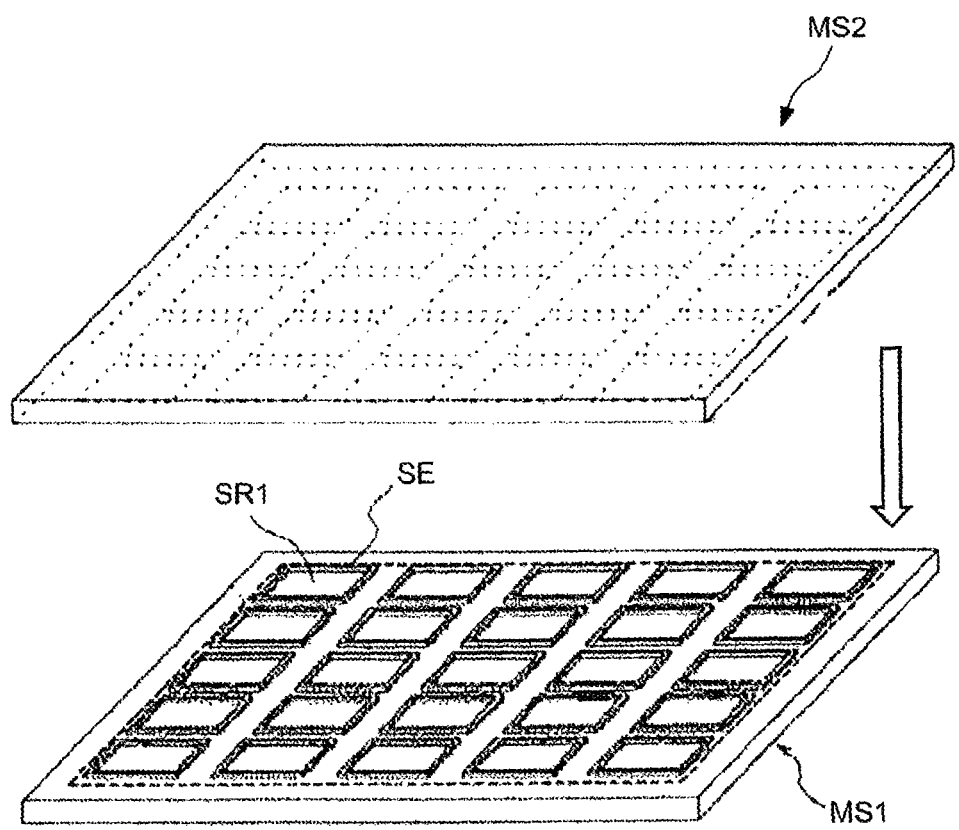
FIG. 15B is a perspective view illustrating a step ST5 in FIG. 14.
Figure 16A:
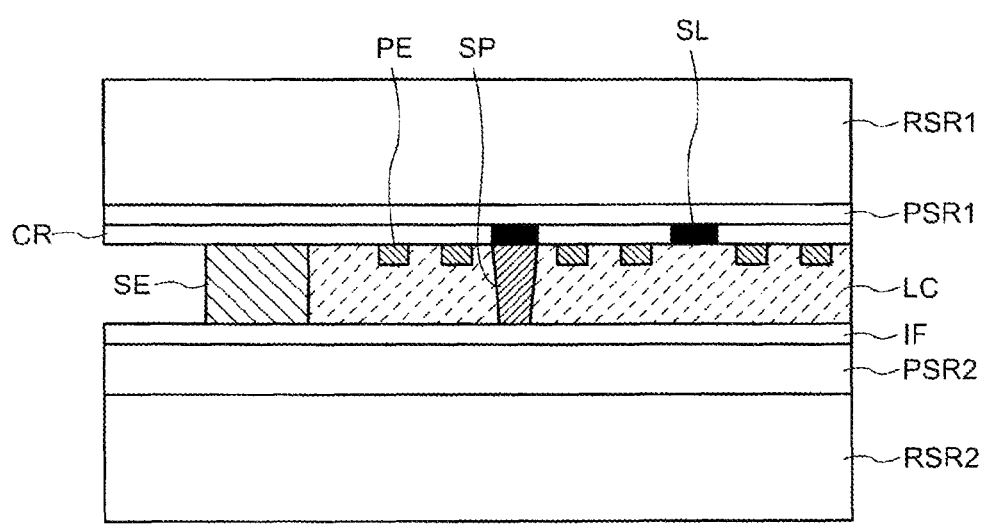
FIG. 16A is a cross-sectional view illustrating the step ST5 in FIG. 14.

In step ST4, a sealant SE is drawn in a frame shape in a region corresponding to each of a plurality of first substrates SR1 (see FIG. 15A). A liquid crystal material is dropped inside of the frame shape of the sealant SE using a dropping device 23 (a dropping liquid crystal step ST4), as illustrated in FIG. 15A. Then, the first precursor substrate MS1 and the second precursor substrate MS2 are bonded each other, and the sealant SE is cured (a first bonding step ST5), as illustrated in FIG. 15B. A display cell, which has passed through the first bonding step ST5, is configured as illustrated in FIG. 16A.

Figure 16B:
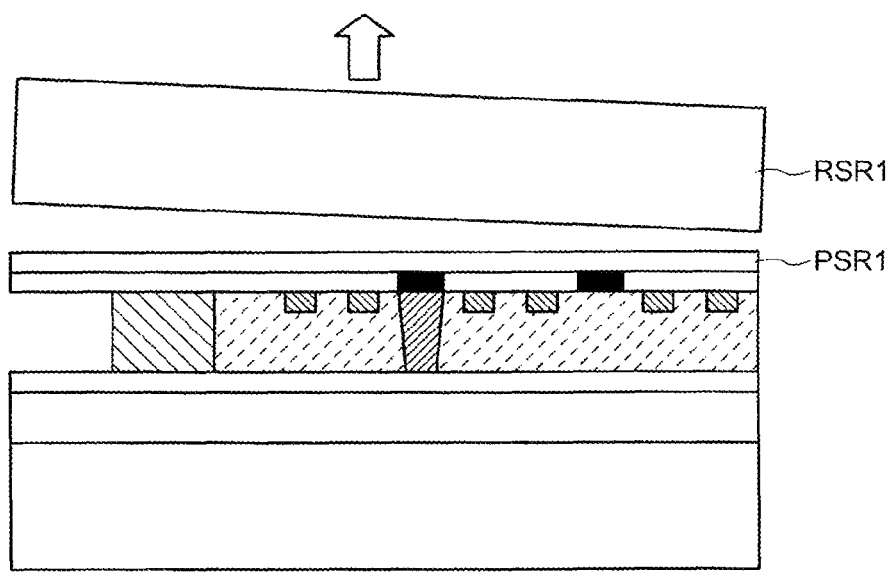
FIG. 16B is a cross-sectional view illustrating a step ST6 in FIG. 14.

Then, when laser light is irradiated onto the first resin base PSR1 via the translucent first rigid substrate RSR1, the first resin base PSR1 absorbs the laser light to slightly sublime. As a result, a gap occurs in an interface between the first resin base PSR1 and the first rigid substrate RSR1, and the first rigid substrate RSR1 is peeled from the first resin base PSR1 (a first peeling step ST6), as illustrated in FIG. 16B. The first substrate SR1 is obtained by the step ST6.

Figure 17A:
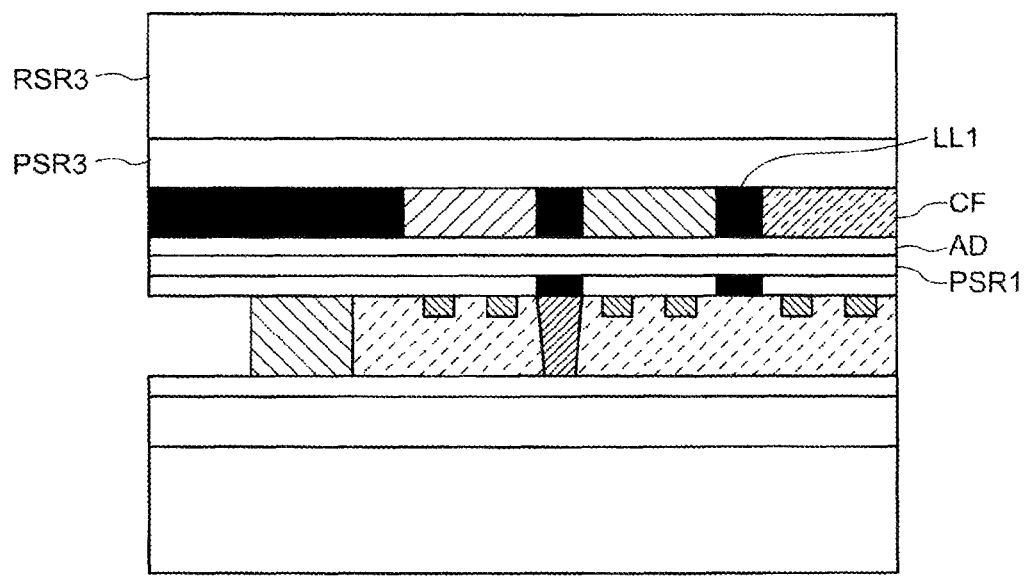
FIG. 17A is a cross-sectional view illustrating a step ST7 in FIG. 14.
Figure 17B:
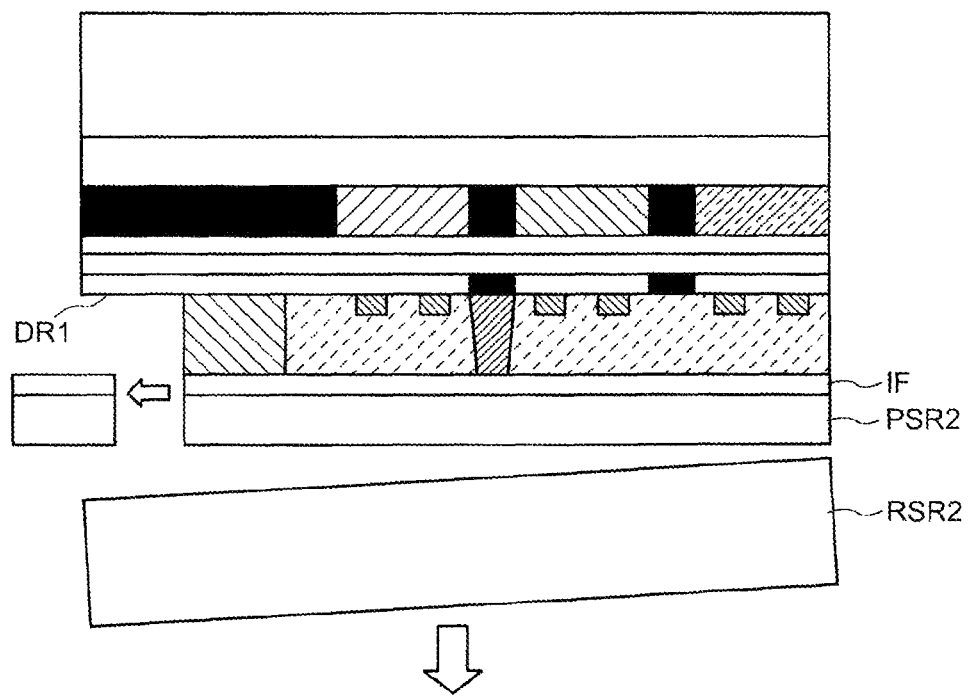
FIG. 17B is a cross-sectional view illustrating a step ST9 in FIG. 14.

Then, a third precursor substrate including a third substrate SR3 is bonded to an exposed surface of the first resin base PSR1 with an adhesive layer AD interposed therebetween (a second bonding step ST7), as illustrated in FIG. 17A. Then, a precursor substrate group including the first substrate SR1 is divided into a plurality of display cells using laser light or a sharped shape blade. In this step, a part of the second rigid substrate RSR2 facing to a first driving region DR1 is also cut (a dividing step ST8). Then, the second rigid substrate RSR2 is peeled from the second resin base PSR2 using laser light (a second peeling step ST9), like in the first peeling step ST6. As a result of the second peeling step ST9, the first driving region DR1 in the first substrate SR1 is exposed from the second resin base PSR2, as illustrated in FIG. 17B.

Figure 18A:
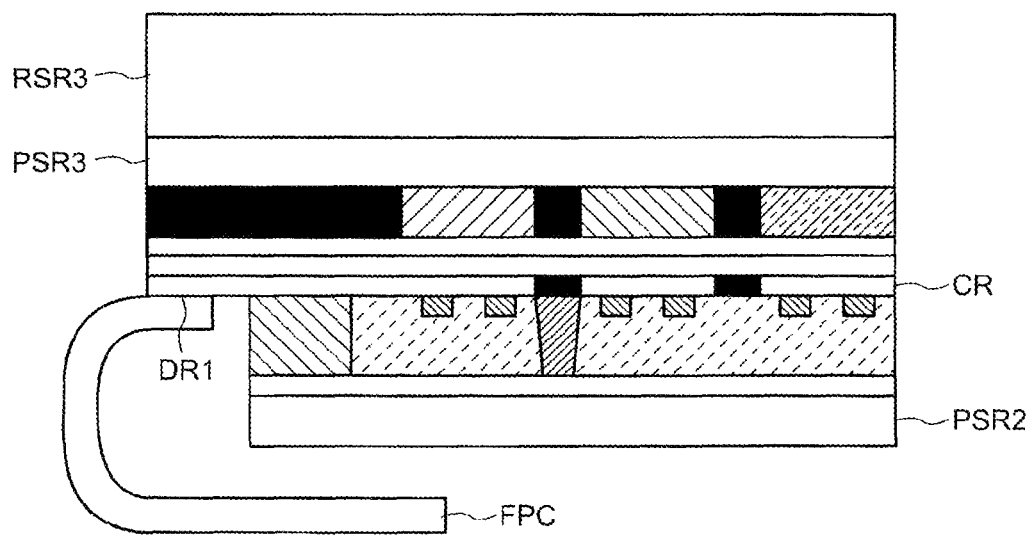
FIG. 18A is a cross-sectional view illustrating a step ST10 in FIG. 14.
Figure 18B:
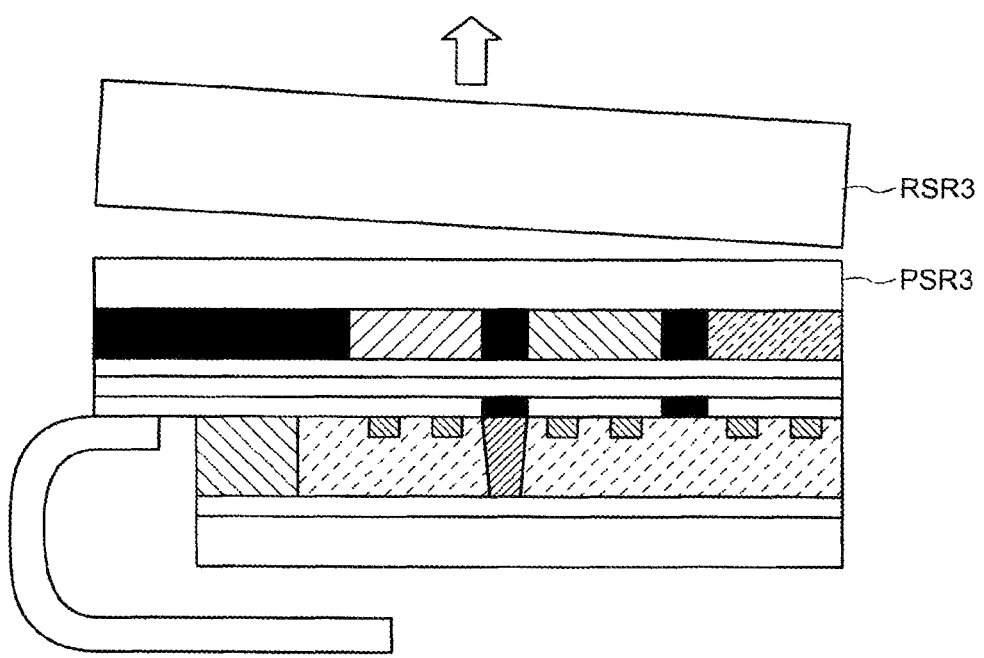
FIG. 18B is a cross-sectional view illustrating a step ST11 in FIG. 14.

A flexible circuit board FPC is thermocompression-bonded to the first driving region DR1 with an anisotropic conductive film interposed therebetween (a connecting step ST10), as illustrated in FIG. 18A. In this step, if the connecting step ST10 is performed with the third rigid substrate RSR3 as the bottom, the third rigid substrate RSR3 serves as a foundation of the first resin base PSR1. Thus, the flexible circuit board FPC can be reliably pressure-bonded to the first driving region DR1. As a result, favorable connection between the flexible circuit board FPC and the first driving region DR1 can be obtained. A surface of the second resin base PSR2 may be protected by a protection film, if needed. Then, the third rigid substrate RSR3 is peeled from the third resin base PSR3 using laser light (a third peeling step ST11), as illustrated in FIG. 18B, like in the first peeling step ST6. The display cell according to the present embodiment can be obtained by passing through the steps. Then, optical films such as a polarizer plate PR and a phase difference plate PDS are bonded to the display cell.

(Second Embodiment)

Figure 19:
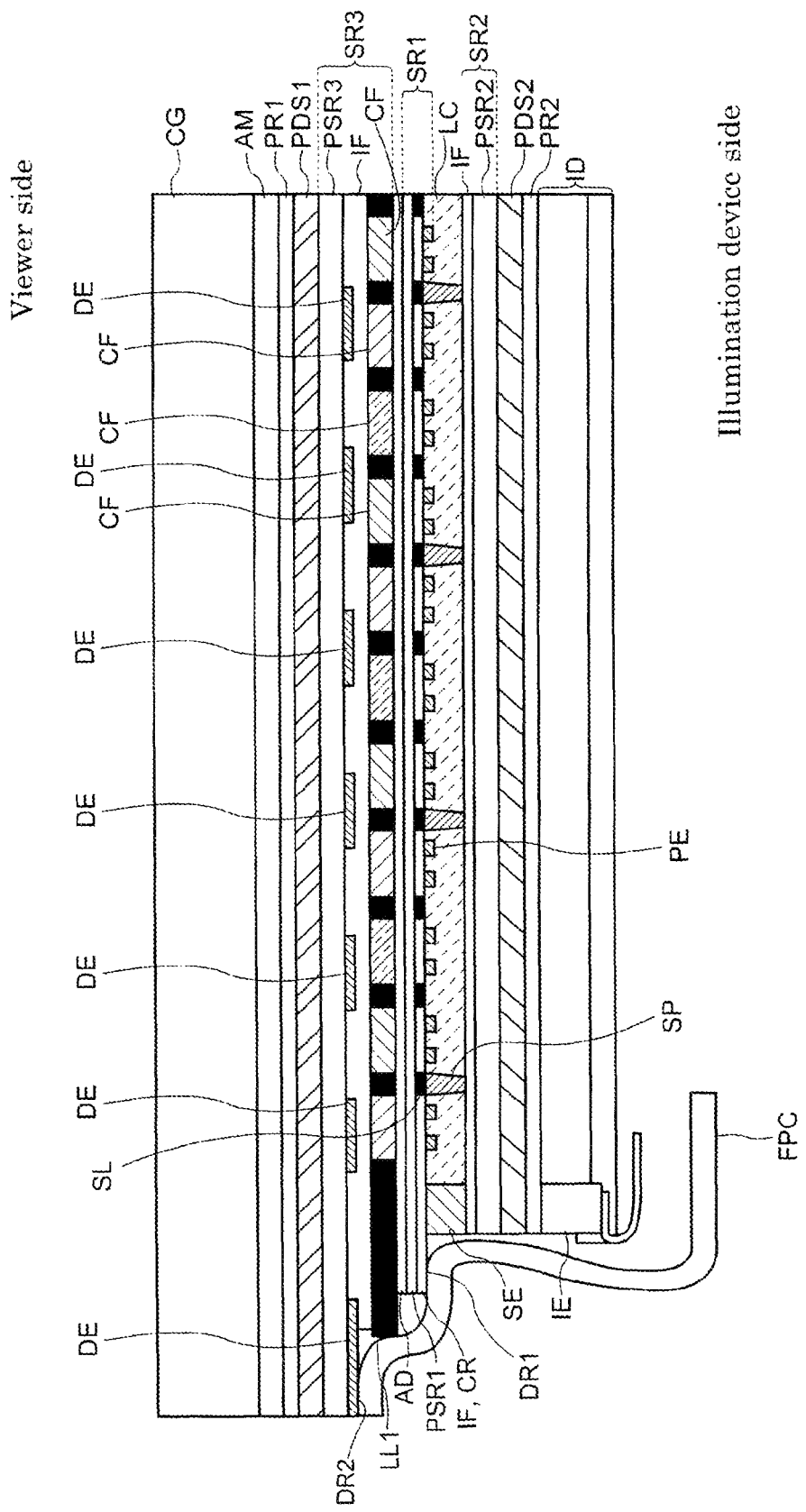
FIG. 19 is a cross-sectional view of a display device according to a second embodiment.

A second embodiment of the present invention will be described below with reference to FIG. 19. A display panel PNL illustrated in FIG. 19 includes a first substrate SR1, a second substrate SR2, a third substrate SR3, a polarizer plate PR, a phase difference plate PDS, a flexible wiring board FPC, and an illumination device ID, like in FIG. 1. FIG. 19 and FIG. 1 differ in respective structures of the third substrate SR3 and the flexible wiring board FPC. Other features and effects based on the features are similar to those in the first embodiment.

The third substrate SR3 in the second embodiment includes a detection electrode DE which detects proximity or contact of an object. That is, the third substrate SR3 has a function of touch detection. The third substrate SR3 is arranged at a position closer to a cover member CG than the first substrate SR1 and the second substrate SR2, and is appropriate for a substrate made to have a function of touch detection. The detection electrode DE is arranged between a third resin base PSR3 and a color filter CF, and is covered by an insulating film IF. A detection type by the detection electrode DE is not particularly limited. An example of the detection type is an electrostatic capacitance type or an electromagnetic induction type. The electrostatic capacitance type may be either a self-capacitance type or a mutual capacitance type.

The flexible wiring board FPC includes a driving circuit for display and a driving circuit for detection. The detection electrode DE is connected to the flexible wiring board FPC via a detection wiring DL illustrated in FIG. 21 in a second driving region DR2. The flexible wiring board FPC is also connected to a first driving region DR1 in the first substrate SR1. This configuration enables one flexible wiring board FPC to be used for both driving for performing touch detection and driving for performing image display. Therefore, the number of flexible wiring boards FPC can be reduced. When the number of components is reduced, the manufacturing cost of a display device is reduced.

An end of the third substrate SR3 provided with the second driving region DR2 is arranged outer side of the display device than an end of the first substrate SR1 provided with the first driving region DR1 in a planar view. The flexible wiring board FPC is arranged from the outside to the inside of the display device. This configuration causes connection between the flexible wiring board FPC and both the first and third substrates SR1 and SR3 to be implemented by a compact structure. A structure of the flexible wiring board FPC is not limited to that illustrated in FIG. 19. For example, the flexible wiring board FPC may be arranged from the first driving region DR1 to the second driving region DR2 and connected to the second driving region DR2, as illustrated in FIG. 20.

Figure 21:
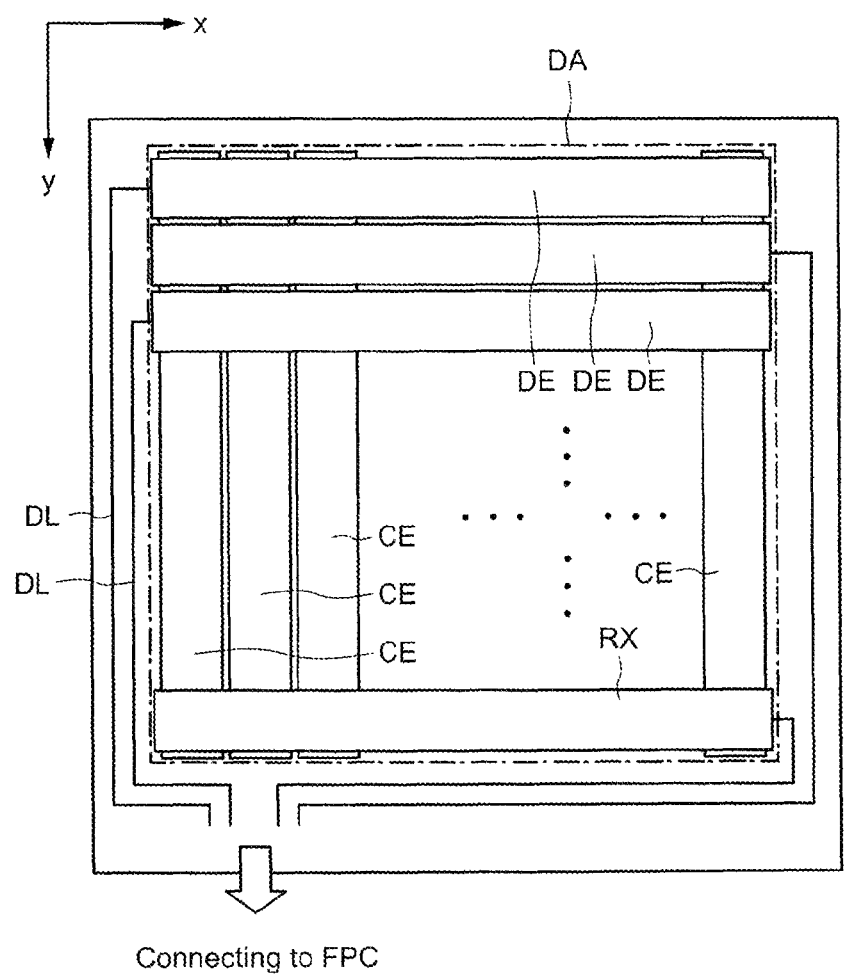
FIG. 21 is a planar view of a common electrode and detection electrodes in the second embodiment.

FIG. 21 illustrates an example of a structure of a detection electrode DE according to the second embodiment in the display region DA. FIG. 21 is a planar view illustrating a relationship between a plurality of detection electrodes DE in the third substrate SR3 and a common electrode CE in the first substrate SR1. A display device illustrated in FIG. 21 adopts a detection type serving as a mutual capacitance system. The common electrode CE illustrated in FIG. 21 is a Tx (Transmitter exchange) electrode, and the detection electrode DE is an Rx (Receiver exchange) electrode. The common electrode CE is separated into a plurality of common electrode elements. The common electrode elements are arranged in a first direction X and each of the common electrodes elements extends in a second direction Y. On the other hand, each of the detection electrodes DE extends in the first direction X and the detection electrodes DE are arranged in the second direction Y. The common electrode elements may be arranged in the second direction Y and may each of the common electrodes elements extend in the first direction X. Each of the detection electrodes DE may each extend in the second direction Y and the detection electrodes DE may be arranged in the first direction X.

Figure 20:
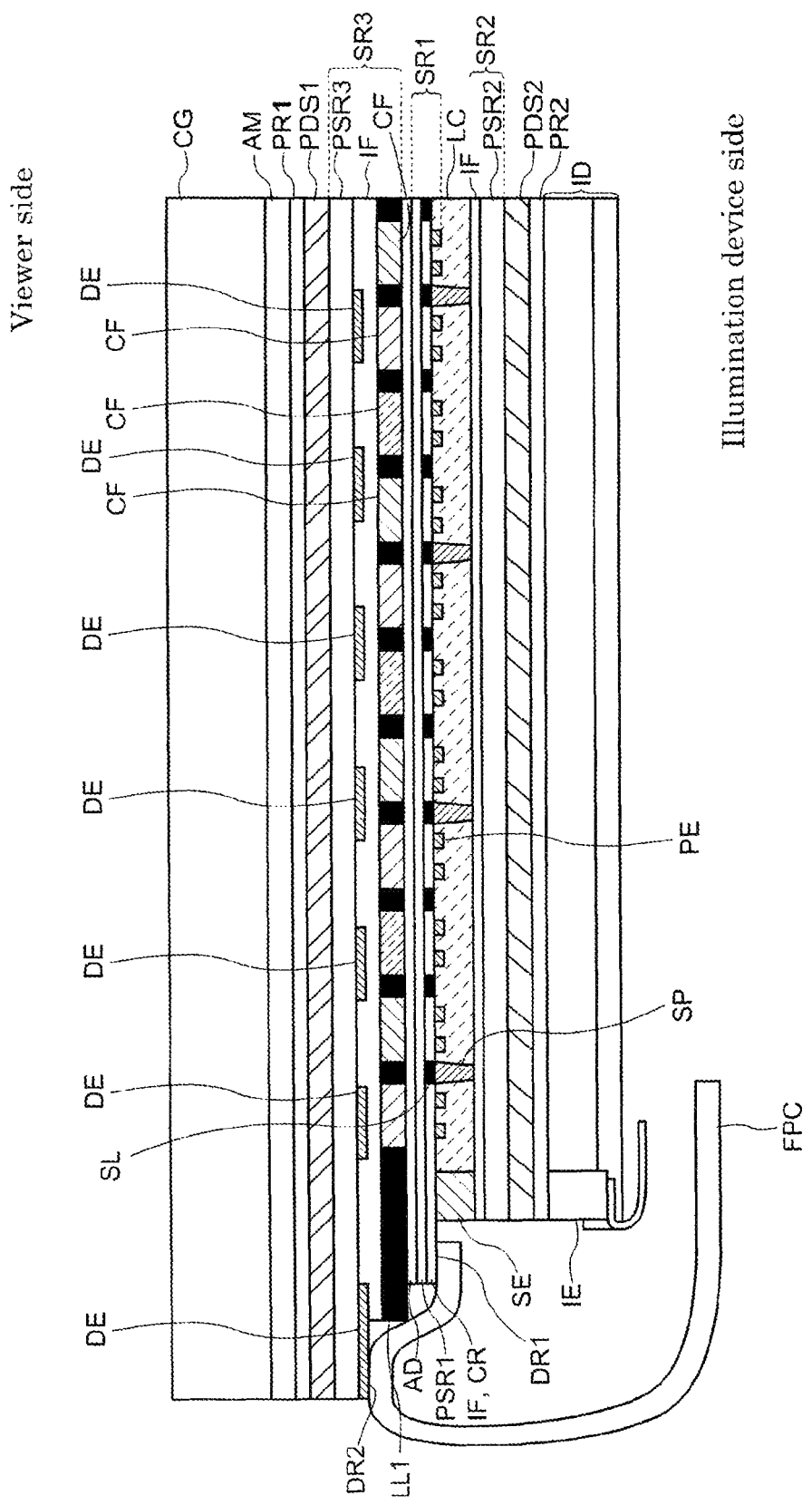
FIG. 20 is a cross-sectional view of a display device according to a modification to the second embodiment.

Each of the detection electrodes DE is electrically connected to the driving circuit for detection in the flexible circuit board FPC illustrated in FIG. 20 via the corresponding detection wiring DL. The common electrode CE receives a common potential for display in a display period, and receives a reference potential for detection in a detection period. The common electrode CE receives the common potential and the reference potential in a time-divisional manner. On the other hand, in a detection period of the common electrode CE, the detection electrode DE receives a detection potential. In the detection period, the display panel PNL monitors a change in difference between the reference potential and the detection potential by an external touch, and judges that a changed site has been touched.

In the second embodiment based on respective structures illustrated in FIGS. 19, 20, and 21, a common electrode (Tx) and a detection electrode (Rx) used in a mutual capacitance type are drivable by one flexible wiring board FPC. This configuration makes design of a circuit structure easy and enables compactness of the display panel PNL to be implemented. When the number of components is reduced, the manufacturing cost of the display panel PNL is reduced.

(Third Embodiment)

Figure 22:
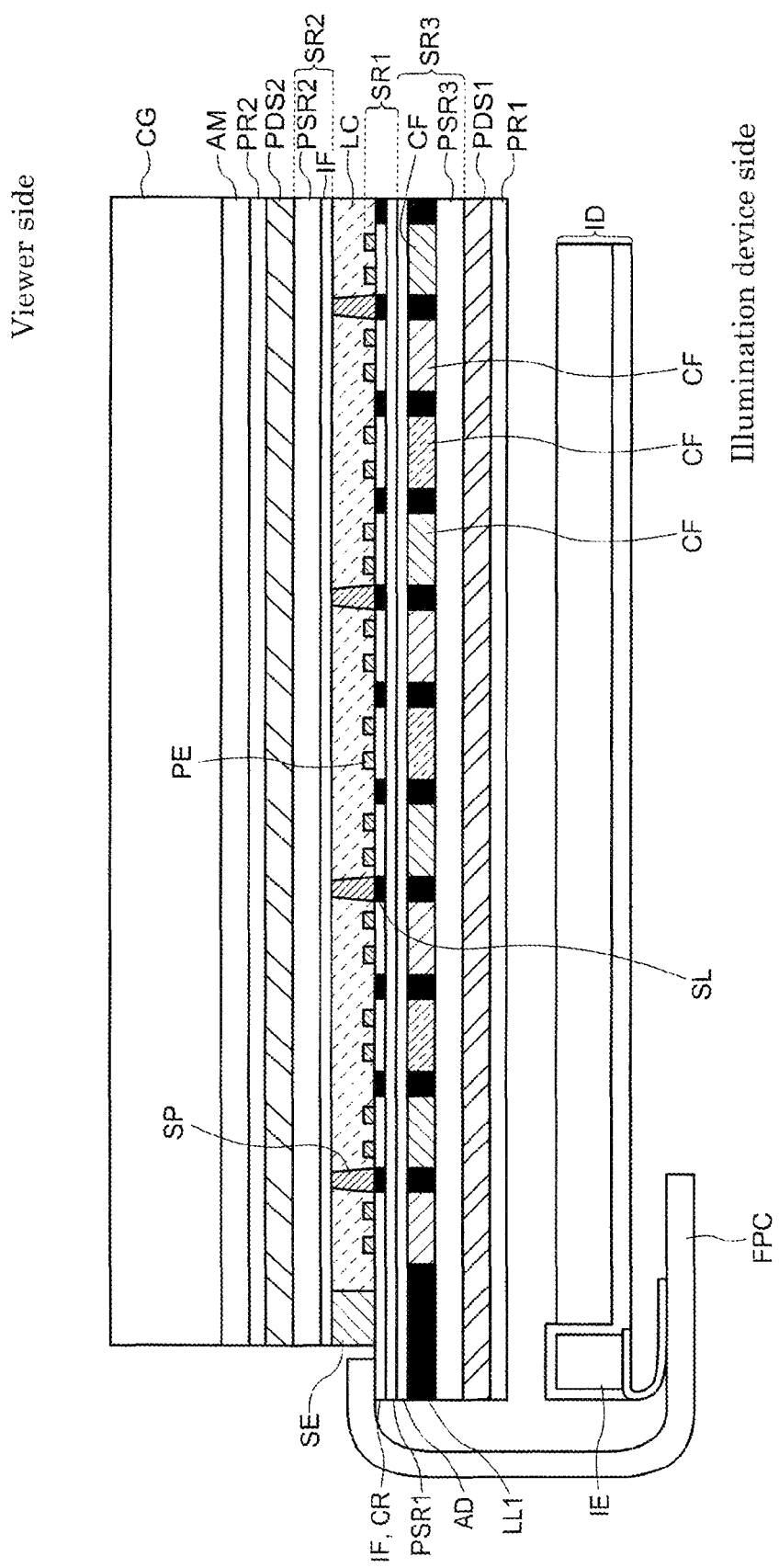
FIG. 22 is a cross-sectional view of a display device according to a third embodiment.

FIG. 22 is a cross-sectional view based on a third embodiment of the present invention. A display panel PNL illustrated in FIG. 22 includes a first substrate SR1, a second substrate SR2, a third substrate SR3, a polarizer plate PR, a phase difference plate PDS, a flexible wiring board FPC, and an illumination device ID, like in FIG. 1. FIG. 22 and FIG. 1 differ in arrangement order of the first substrate SR1, the second substrate SR2, and the third substrate SR3. In the first embodiment and the second embodiment, the third substrate SR3 including a color filter CF is arranged on the side closer to a cover member CG (on the side closer to a viewer) than the second substrate SR2. On the other hand, in the third embodiment, the first substrate SR1 and the second substrate SR2 are arranged on the side closer to the cover member CG (on the side closer to the viewer) than the third substrate SR3 including the color filter CF. While the second substrate SR2 does not have a light shielding film in FIG. 22, the light shielding film may be formed in an upper layer of a circuit layer CR. Further, the second substrate SR2 may have a light shielding film formed therein. By forming the light shielding film, external light is reflected on each of wiring layers in the first substrate SR1. Thus, image visibility under an external light environment can be improved. Other features and effects based on the features of the third embodiment are similar to those of the first and second embodiments.

(Fourth Embodiment)

Figure 23:
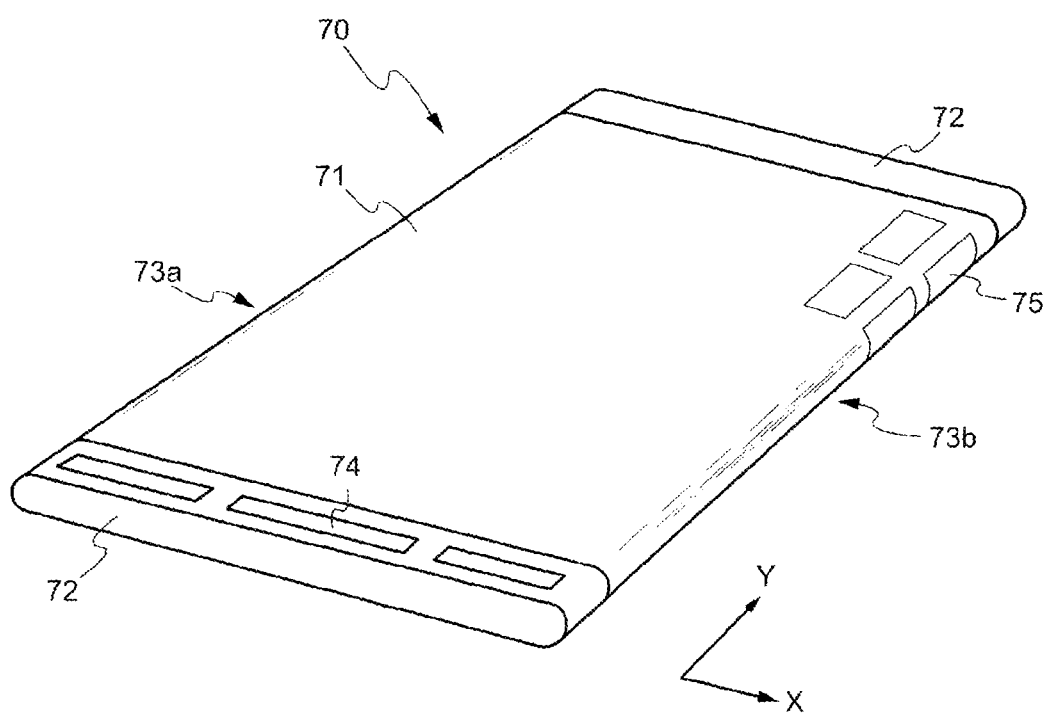
FIG. 23 is a perspective view of an electronic device which adopts the display device according to each of the embodiments.

FIG. 23 is a perspective view illustrating an example of a display device 70 having a display panel PNL according to the present embodiments. More specifically, a mobile phone (smartphone) is illustrated as the display device 70.

The display device 70 includes a display screen 71, a frame section 72, and curved ends 73a and 73b. In the present embodiment, the ends 73a and 73b in an X-direction of the display screen 71 are curved when seen in a planar view. The frame section 72 is provided with an input section 74 composed of hardware such as a power button. At the ends 73a and 73b, objects 75 composing a user interface such as icons can be displayed.

While the ends 73a and 73b of the display screen 71 in the X-direction are curved in the present embodiment, the present invention is not limited to this example. For example, the two sides of the display screen 71 may be curved in not only the X-direction but also a Y-direction so that respective ends of all the four sides of the display screen 71 can be curved. In the case, a display device having no frame portion in a planar view can be implemented. The two sides in the Y-direction of the display screen 71 may be curved.

The above-described embodiments of the present invention can be performed by being appropriately combined as long as they are not mutually inconsistent with one another. While addition, deletion, or design change of a component or components or addition, deletion, or condition change of a process or processes appropriately performed by those skilled in the art based on the display panel in each of the embodiments is also included in the scope of the invention without departing from the gist of the invention.

It is understood that other functions and effects different from the functions and effects produced by the above-described embodiments, which are apparent from the description of the present specification or could have been easily predicted by those skilled in the art, are naturally provided by the present invention.

What is claimed is:

1. A display panel comprising:
  a first substrate including a pixel electrode;
  a second substrate;
  a third substrate including a first light shielding film and a color filter; and
  a liquid crystal layer located between the first substrate and the second substrate,
  wherein
  the first substrate is located between the liquid crystal layer and the color filter,
  the first substrate includes a first resin base, or the second substrate includes a second resin base, and
  the first substrate includes the first resin base and a third light shielding film.

2. The display panel according to claim 1, further comprising a first polarizer plate,
  wherein the color filter is located between the first substrate and the first polarizer plate.

3. The display panel according to claim 1, further comprising:
  an illumination device; and
  a transistor electrically connected to the pixel electrode, wherein
  the transistor includes a semiconductor layer,
  the second substrate is located between the illumination device and the liquid crystal layer, and
  the first substrate includes a second light shielding film located between the semiconductor layer and the illumination device.

4. The display panel according to claim 1, wherein the first substrate is closer to a viewer of the display panel than the second substrate.

5. The display panel according to claim 1, wherein
  the color filter includes a first color filter layer and a second color filter layer which are adjacent to each other, and
  the first light shielding film is located between a part of the first color filter layer and a part of the second color filter layer in a planar view.

6. The display panel according to claim 5, wherein the first light shielding film is closer to the first substrate than the color filter.

7. The display panel according to claim 5, further comprising an adhesive layer bonding the first substrate and the third substrate to each other, wherein
  the first substrate includes a first resin base, and
  the adhesive layer contacts the color filter and the first resin base, to bond the color filter and the first resin base to each other.

8. The display panel according to claim 1, further comprising:
  an adhesive layer bonding the third substrate and the first substrate to each other,
  wherein the thickness of the adhesive layer is defined by a protrusion in the third substrate.

9. The display panel according to claim 6, further comprising:
  a first metal wiring located in the first substrate and overlapping the first light shielding film in a planar view; and
  a video line located in the first substrate and overlapping the first light shielding film in a planar view, wherein
  the first metal wiring is a wiring, closest to the first resin base, among one or more wirings overlapping the first light shielding film, and
  a width of the first metal wiring is larger than a width of the video line.

10. The display panel according to claim 6, further comprising:
a common electrode;
a second metal wiring located in the first substrate and overlapping the first light shielding film in a planar view; and
a video line located in the first substrate and overlapping the first light shielding film in a planar view, wherein
the second metal wiring is connected to the common electrode, and
a width of the second metal wiring is larger than a width of the video line.

11. The display panel according to claim 1, wherein
the first substrate includes a first resin base,
the second substrate includes a second resin base, and
a thickness of the first resin base is smaller than a thickness of the second resin base.

12. The display panel according to claim 1, wherein
the first substrate includes a first resin base,
the third substrate includes a third resin base, and
a thickness of the first resin base is smaller than a thickness of the third resin base.

13. The display panel according to claim 1, further comprising:
a first phase difference plate located on a side opposite to a side the first substrate is arranged with respect to the third substrate; and
a second phase difference plate located on a side opposite to a side the first substrate is arranged with respect to the second substrate, wherein
the first substrate includes a first resin base,
the second substrate includes a second resin base,
the third substrate includes a third resin base, and
a phase difference compensation amount for light of the first phase difference plate is larger than a phase difference compensation amount for light of the second phase difference plate.

14. The display panel according to claim 1, further comprising:
a detection electrode located in the third substrate and detecting external proximity or contact.

15. The display panel according to claim 1, wherein a screen resolution of the display panel is 450 ppi or less.

* * * * *